United States Patent [19]
Kokubo et al.

[11] Patent Number: 5,818,089
[45] Date of Patent: Oct. 6, 1998

[54] SEMICONDUCTOR MEMORY DEVICE

[75] Inventors: Nobuyuki Kokubo; Kazuya Ikeda, both of Hyogo, Japan

[73] Assignee: Mitsubishi Denki Kabushiki Kaisha, Tokyo, Japan

[21] Appl. No.: 815,087

[22] Filed: Mar. 11, 1997

Related U.S. Application Data

[63] Continuation of Ser. No. 462,724, Jun. 6, 1995, abandoned.

[30] Foreign Application Priority Data

Oct. 31, 1994 [JP] Japan .................................... 6-267655

[51] Int. Cl.⁶ .......................... H01L 29/76; H01L 29/94; H01L 31/062; H01L 31/113
[52] U.S. Cl. .......................... 257/368; 257/903; 257/904; 257/393
[58] Field of Search ..................... 257/368, 903, 257/904, 393

[56] References Cited

U.S. PATENT DOCUMENTS 5,107,322  4/1992  Kimura .
5,350,933  9/1994  Yoshihara .

FOREIGN PATENT DOCUMENTS

| 4-61160 | 2/1992 | Japan . |
|---|---|---|
| 4-78164 | 3/1992 | Japan . |
| 4-85877 | 3/1992 | Japan . |
| 4-146670 | 5/1992 | Japan . |
| 4-162473 | 6/1992 | Japan . |
| 4-302471 | 10/1992 | Japan . |
| 4-330776 | 11/1992 | Japan . |
| 5-13443 | 1/1993 | Japan . |
| 5-160371 | 6/1993 | Japan . |
| 5-275652 A | 10/1993 | Japan . |
| 6-13575 | 1/1994 | Japan . |
| 6-132498 A | 5/1994 | Japan . |
| 9409608 B1 | 10/1994 | Rep. of Korea . |

*Primary Examiner*—Stephen Meier
*Attorney, Agent, or Firm*—McDermott, Will & Emery

[57] ABSTRACT

In a memory cell region, there are formed a pair of driver transistors and a pair of access transistors. On an insulating layer covering these transistors, there are formed a pair of high resistances. To cover the high resistances, there is formed an insulating layer. On the insulating layer, there is formed a word line. To cover the word line, there is formed an insulating layer and, on the insulating layer, there are formed a GND wiring and bit lines. Thereby, a semiconductor memory device capable of stabilized operation even when a lowered power source voltage is used can be obtained.

16 Claims, 33 Drawing Sheets

SEMICONDUCTOR MEMORY DEVICE

This application is a continuation of application Ser. No. 08/462,724 filed Jun. 6,1996, now abandoned.

BACKGROUND OF THE INVENTION

1. Field of the Invention

The present invention relates to a semiconductor device and, more particularly, to a semiconductor device including an SRAM (Static Random Access Memory).

2. Description of the Background Art

As one of the conventional memory devices, the SRAM is known. The SRAM has advantages over a DRAM (Dynamic Random Access Memory) that it needs no refreshing operations and its storage conditions are stable.

FIG. 28 is an equivalent circuit diagram of an SRAM memory cell of a high-resistance load type. Referring to FIG. 28, the memory cell has a pair of high resistances R1 and R2 as its load and, further, includes a pair of driver transistors Q1 and Q2 and a pair of access transistors Q3 and Q4.

The pair of the high resistances R1 and R2 are connected with the Vcc power supply at one ends and with memory nodes N1 and N2 at the other ends.

The pair of the driver transistors Q1 and Q2 and the pair of the access transistors Q3 and Q4 are formed of MOS (Metal Oxide Semiconductor) transistors. Each of the source regions of the pair of the driver transistors Q1 and Q2 is connected with GND (ground potential). The drain region of the driver transistor Q1 is connected with the memory node N1 and the drain region of the driver transistor Q2 is connected with the memory node N2. The gate of the driver transistor Q1 is connected with the memory node N2 and the gate of the driver transistor Q2 is connected with the memory node N1.

One of the pair of the source/drain regions of the access transistor Q3 is connected with the memory node N1 and the other of the pair of the source/drain regions is connected with a bit line BL1. One of the pair of the source/drain regions of the access transistor Q4 is connected with the memory node N2 and the other of the pair of the source/drain regions is connected with a bit line BL2. The gates of the access transistors Q3 and Q4 are connected with a word line WL.

A concrete memory cell structure of the high resistance load type SRAM is proposed for example in the U.S. application Ser. No. 08/309,833 (filed on Sep. 21, 1994). FIG. 29 to FIG. 32 are planar structural drawings of the SRAM memory cell structure proposed in the above reference showing the structure separated into four levels from the bottom up. In concrete terms, FIG. 29 shows the structure of the pair of the driver transistors Q1 and Q2 and the pair of the access transistors Q3 and Q4 formed on a substrate. FIG. 30 shows the structure of the word line and the GND line. FIG. 31 shows the structure of the pair of the high resistances R1 and R2, and FIG. 32 shows the structure of the bit line.

Referring first to FIG. 29, there are formed the pair of the driver transistors Q1 and Q2 and the pair of the access transistors Q3 and Q4 on the surface of a silicon substrate 301.

The driver transistors Q1 has a drain region 311*b*, a source region 311*c*, a gate insulating layer (not shown), and a gate electrode layer 325*a*. The drain region 311*b* and the source region 311*c* are formed of an n-type diffused region and spaced apart to define a channel region therebetween. The gate electrode layer 325*a* is formed in confrontation with the channel region with the gate insulating layer interposed therebetween.

The driver transistors Q2 has a drain region 321*b*, a source region 321*c*, a gate insulating layer (not shown), and a gate electrode layer 325*b*. The drain region 321*b* and the source region 321*c* are formed of an n-type diffused region and spaced apart to define a channel region therebetween. The gate electrode layer 325*b* is formed in confrontation with the channel region with the gate insulating layer interposed therebetween.

The access transistor Q3 has a pair of source/drain regions 311*a* and 311*b*, a gate insulating layer (not shown), and a gate electrode layer 315*a*. The pair of the source/drain regions 311*a* and 311*b* are formed of an n-type diffused region and spaced apart to define a channel region therebetween. The gate electrode layer 315*a* is formed in confrontation with the channel region with the gate insulating layer interposed therebetween.

The access transistor Q4 has a pair of source/drain regions 321*a* and 321*b*, a gate insulating layer (not shown), and a gate electrode layer 315*b*. The pair of the source/drain regions 321*a* and 321*b* are formed of an n-type diffused region and spaced apart to define a channel region therebetween. The gate electrode layer 315*b* is formed in confrontation with the channel region with the gate insulating layer interposed therebetween.

The gate electrode layers 315*a*, 315*b*, 325*a*, and 325*b* are each formed of a single layer of a polycrystalline silicon layer doped with impurities (hereinafter referred to as doped polycrystalline silicon layer) and its sheet resistance is around 40 Ω/□.

The drain region 311*b* of the driver transistor Q1 and the source/drain region 311*b* of the access transistor Q3 are formed of the same n-type diffused region. The drain region 321*b* of the driver transistor Q2 and the source/drain region 321*b* of the access transistor Q4 are formed of the same n-type diffused region.

The gate electrode layer 325*a* of the driver transistor Q1 is electrically connected with the n-type diffused region 321*b*. The gate electrode layer 325*b* of the driver transistor Q2 is electrically connected with the n-type diffused region 311*b*.

Referring to FIG. 30, an insulating layer (not shown) is formed all over the surface of the substrate to cover the gate electrode layers 315*a*, 315*b*, 325*a*, and 325*b*. The insulating layer has contact holes 331*h*, 331*i*, 331*j*, and 331*k* formed therein.

A conducting layer 331*a* is formed in contact with the gate electrode layer 315*a* of the access transistor Q3 through the contact hole 331*h*. Further, a conducting layer 331*b* is formed in contact with the gate electrode layer 315*b* of the access transistor Q4 through the contact hole 331*i*. The conducting layers 331*a* and 331*b* are used for the word lines.

There is formed a conducting layer 331*c* in contact with the source region 311*c* of the driver transistor Q1 through the contact hole 331*j* and in contact with the source region 321*c* of the driver transistor Q2 through the contact hole 331*k*. The conducting layer 331*c* is used for the GND wiring.

The conducting layers 331*a*, 331*b*, and 331*c* are each formed of a compound layer of a doped polycrystalline silicon layer and a high melting point silicide layer and its sheet resistance is around 5–15 Ω□.

Referring to FIG. 31, an insulating layer (not shown) is formed to cover the conducting layers 331*a*, 331*b*, and 331*c*.

The insulating layer has contact holes 341h and 341i formed therein. There is formed a resistance layer 341a in contact with the gate electrode layer 325a of the driver transistor Q1 through the contact hole 341h. The resistance layer 341a has a high resistance region 343b with a relatively high resistance value and low resistance regions 343a and 343c with relatively low resistance values. Further, there is formed a resistance layer 341b in contact with the gate electrode layer 325b of the driver transistor Q2 through the contact hole 341i. The resistance layer 341b has a high resistance region 345b with a relatively high resistance value and low resistance regions 345a and 345c with relatively low resistance values.

The high resistance regions 345b and 343b form the high resistances R1 and R2, respectively. The low resistance regions 343a and 345a are formed in contact with the layer under the same through the contact holes 341h and 341i, respectively. The low resistance regions 343c and 345c are used for the Vcc wirings.

The resistance layers 341a and 341b are formed by injecting n-type impurities with resist patterns 347a and 347b used as masks. Namely, the regions into which impurities are injected become the low resistance regions 343a, 343c, 345a, and 345c and the regions free from the injection become the high resistance regions 343b and 345b.

Referring to FIG. 32, there is formed an insulating layer (not shown) to cover the resistance layers 341a and 341b. In the insulating layer, there are formed contact holes 351h and 351i. There is formed a wiring layer 351a in contact with the source/drain region 311a of the access transistor Q3 through the contact hole 351h. Also, there is formed a wiring layer 351b in contact with the source/drain region 321a of the access transistor Q4 through the contact hole 351i.

The wiring layers 351a and 351b have a laminated structure of a TiN layer, an Al—Si—Cu layer, and a TiN layer and the sheet resistance of the same is around 50 mΩ/□. The wiring layers 351a and 351b are used for the bit lines.

With the SRAM memory cell structure shown in the above described FIG. 29 to FIG. 32, there has been a problem that the resistance of the GND wiring becomes high and the operating margin becomes small. The problem will be described below in detail.

Referring to FIG. 30 and FIG. 31, the high resistances R1 and R2 are formed on the layer over the GND line 331c and the word lines 331a and 331b. One ends of the high resistances R1 and R2 must be connected with n-type diffused regions 311b and 321b (FIG. 29) through the contact holes 341h and 341i, respectively. Therefore, the layout of the GND line 331c and the word lines 331a and 331b on the layer under the high resistances R1 and R2 is subject to restrictions due to the contact holes 341h and 341i.

More specifically, there is the need for the GND line 331c and the word lines 331a and 331b to be kept out of the contact holes 341h and 341i. Therefore, it has been inevitable that the widths of the GND line 331c and the word lines 331a and 331b become smaller and their paths become more complex and longer. Accordingly, the wiring resistance of the GND line 331c and the word lines 331a and 331b become higher. Especially, the increase in wiring resistance of the GND line 331c presents the following problems.

FIG. 33 is a diagram showing a portion of an equivalent circuit of the interior of an SRAM memory cell array. Referring to FIG. 33, when the data is read, the access transistors Q3 and Q4 are turned ON as the word line WL is activated (rendered High, i.e., selected). The source/drain of the access transistor Q4 are connected with the memory node "L" and with the Vcc through the load of the bit wire, respectively. Since the potential difference between the memory node "L" and the Vcc is great, a so-called column current I flows in the direction shown by the arrow in the diagram when the access transistor Q4 is turned ON.

Although the access transistor Q3 is also turned ON, since the source/drain are connected with the memory node "H" and Vcc, respectively, the potential difference therebetween is small. Hence, a column current hardly flows on the side of the access transistor Q3.

Thus, the column current I, when the word line WL is activated, flows through the path from Vcc to GND, i.e., Vcc–bit line load–bit line–access transistor Q4–memory node "L"–driver transistor Q2–GND in order of mention.

The GND wiring 331c between one source region (point S1) and the other source region (point S2) of the pair of the driver transistors within the memory cell has its wiring resistance R. Therefore, between S1 and S2, there is produced a potential difference by the column current I flowing through the GND wiring 331c of the value given by (wiring resistance R)×(column current I), i.e., there is regions a source potential difference.

When the word line is activated and data reading is started, since the memory node N1 is "H", the driver transistor Q2 is turned ON allowing the column current I to flow, but the potential of the memory node N2 becomes virtually equal to the source potential S2. Since the source potential S2 is higher than the source potential S1 by the value corresponding to the source potential difference, the potential at the memory node N2 becomes higher correspondingly. As a result, the driver transistor Q1 is turned ON and destruction of stored data due to the fall of the potential at the memory node N1, hence, erroneous reading, occurs.

Thus, when the wiring resistance of the GND wiring 331c is higher, the source potential difference becomes higher, and, hence, there arises a risk of destruction of data or inversion of data.

Especially, when the power source voltage has a tendency to become lower in recent years, the above described difficulties become remarkable.

SUMMARY OF THE INVENTION

It is an object of the present invention to provide a semiconductor memory device capable of stabilized operation without enlarging the layout area of the memory cell even when the design to lower the power supply voltage is made.

Another object of the present invention is to lower the wiring resistance of the GND wiring without enlarging the layout area of the memory cell.

The semiconductor memory device according to the invention is a semiconductor memory device having a static type memory cell, including a pair of access transistors, a pair of driver transistors, and a pair of load elements within the memory cell region, and it comprises a semiconductor substrate, a first access transistor, a second access transistor, a first driver transistor, a second driver transistor, a first insulating layer, a first load element, a second load element, a second insulating layer, a conducting layer for word line, and a conducting layer for grounding.

The semiconductor substrate has a major surface. The first access transistor has a pair of first source/drain regions formed at the major surface of the semiconductor substrate a predetermined distance apart from each other and a first gate electrode layer formed on the major surface of the semiconductor substrate disposed between the pair of the first source/drain regions with a gate insulating film interposed therebetween. The second access transistor has a pair of second source/drain regions formed at the major surface of the semiconductor substrate a predetermined distance apart from each other and a second gate electrode layer formed of the same conducting layer as the first gate electrode layer, separately therefrom, on the major surface of the semiconductor substrate disposed between the pair of the second source/drain regions with a gate insulating film interposed therebetween. The first driver transistor has a pair of third source/drain regions formed at the major surface of the semiconductor substrate a predetermined distance apart from each other and a third gate electrode layer formed on the major surface of the semiconductor substrate disposed between the pair of the third source/drain regions with a gate insulating film interposed therebetween and electrically connected with one of the pair of the second source/drain regions. The second driver transistor has a pair of fourth source/drain regions formed at the major surface of the semiconductor substrate a predetermined distance apart from each other and a fourth gate electrode layer formed on the major surface of the semiconductor substrate disposed between the pair of the third source/drain regions with a gate insulating film interposed therebetween and electrically connected with one of the pair of the first source/drain regions. The first insulating layer is formed to cover the periphery and the top of the gate electrode layer of each of the transistors and has a first hole led to the top face of the fourth gate electrode layer and a second hole led to the top face of the third gate electrode layer formed in it. The first load element is electrically connected with one of the pair of the first source/drain regions through the first hole. The second load element is electrically connected with one of the pair of the second source/drain regions through the second hole. The second insulating layer is formed to cover the first and the second load elements. The first and second insulating layers have a third hole led to the top face of the first gate electrode layer, a fourth hole led to the top face of the second gate electrode layer, and a fifth and a sixth hole led to one of the pair of the third source/drain regions and one of the pair of the fourth source/drain regions, respectively, through the first and second insulating layers. A conducting layer for word line is formed on the second insulating layer and electrically connected with the first and the second gate electrode layers through the third and the fourth holes. A conducting layer for grounding is formed on the second insulating layer and electrically connected with the third and the fourth source regions of the first and the second driver transistors through the fifth and sixth holes.

In the semiconductor memory device of the present invention, invention, the first and second gate electrode layers of the first and second access transistors and the conducting layer for word line are formed on different layers. Therefore, the first and second gate electrode layers are only required to be disposed at the positions confronting the channel regions of the access transistors. Hence, it becomes unnecessary to stretch the gate electrode layer itself so that it laterally cut through the memory cell. Thus, the planar area in the memory cell occupied by the gate electrode layer of the access transistor can be reduced. Accordingly, the planar layout area of the memory cell can be reduced correspondingly to the reduction in the gate electrode layer.

Further, since the planar area occupied by the gate electrode layer of the access transistor is reduced, the degree of freedom of arrangement of the gate electrode layer of the driver transistor formed on the same layer as the gate electrode layer of the access transistor can be extended. Also in this regard, the planar layout area of the memory cell can be reduced.

Further, the conducting layer for grounding and the conducting layer for word line are provided on the layer over the load element. Therefore, the layout of the conducting layer for grounding and the conducting layer for word line is freed from restrictions due to the contact hole for connecting the load element with the transistor formed on the substrate. Accordingly, the degree of freedom of arrangement of the conducting layer for grounding and the conducting layer for word line can be extended. Especially, the width of the conducting layer for grounding can be made larger and its path length can be made smaller than in the structure described in connection with the background art. Consequently, the wiring resistance of the conducting layer for grounding can be reduced and, hence, destruction of data and inversion of data when the data is read can be prevented and stabilized operation of the memory can be achieved.

The semiconductor memory device according to a preferred aspect of the invention further comprises a third insulating layer for covering the conducting layer for word line. The third insulating layer has a seventh hole and an eighth hole passing therethrough. The conducting layer for grounding is formed on the third insulating layer and it is electrically connected with one of the pair of the third source/drain regions through the fifth and seventh holes and further connected with one of the pair of the fourth source/drain regions through the sixth and eighth holes.

In the semiconductor memory device according to a preferred aspect, the conducting layer for grounding is provided over the conducting layer for word line. Hence, it becomes possible to form the conducting layer for grounding with a material whose melting point is lower than the material forming the conducting layer for word line. Aluminum is a material having extremely lower resistance than doped polycrystalline silicon. By the usability of such low resistance material as aluminum, the wiring resistance of the conducting layer for grounding can be made still lower. Accordingly, an SRAM memory cell capable of more stabilized operation can be obtained.

The semiconductor memory device according to another preferred aspect of the invention further comprises a first pad electrode layer formed on the second insulating layer so as to be electrically connected with one of the pair of the third source/drain regions through the fifth hole and a second pad electrode layer formed on the second insulating layer so as to be electrically connected with one of the pair of the fourth source/drain regions through the sixth hole. The first and second pad electrode layers are formed of the same conducting layer as the conducting layer for word line, separately therefrom. The seventh hole is formed to be led to the top face of the first pad electrode layer. The eighth hole is formed to be led to the top face of the second pad electrode layer. The conducting layer for grounding is electrically connected with the first and second pad electrode layers through the seventh and eighth holes.

In the semiconductor memory device according to another preferred aspect of the invention, the conducting layer for bit line is connected with the transistor formed on the substrate by the pad electrode layer interposed therebetween. By the interposition of the pad electrode layer, the degree of freedom of layout of the hole for connecting the conducting layer for bit line with its mating member on the layer under the same can be extended. Therefore, the degree of freedom of arrangement of the conducting layer for bit line is extended and, hence, it is made possible to form the conducting layer for bit line and the conducting layer for grounding on the same layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Preferred embodiments of the invention will be described with reference to the accompanying drawings.

Embodiment 1

Figure 1:
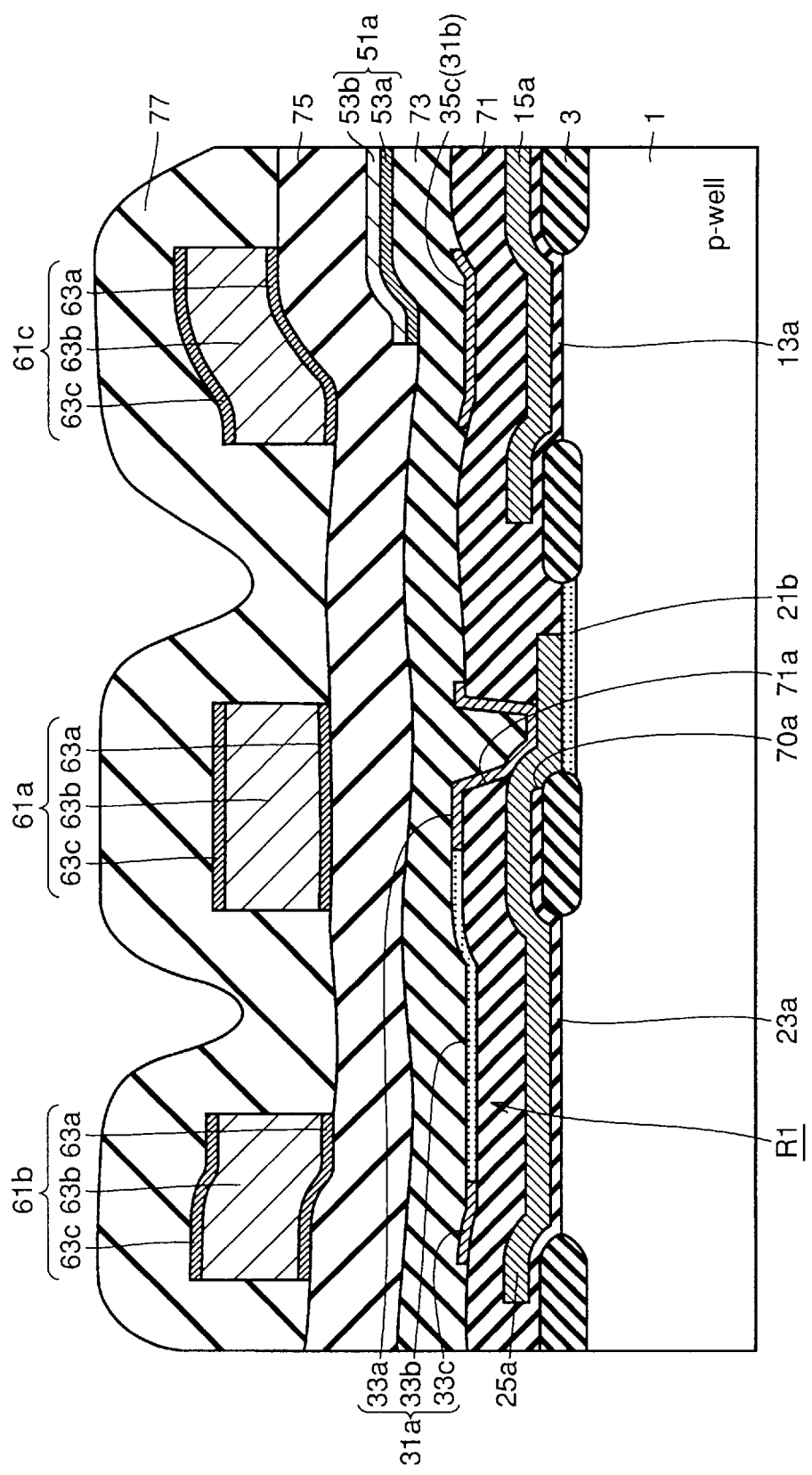
FIG. 1 is a sectional view schematically showing an SRAM memory cell structure according to a first embodiment of the invention.
Figure 2:
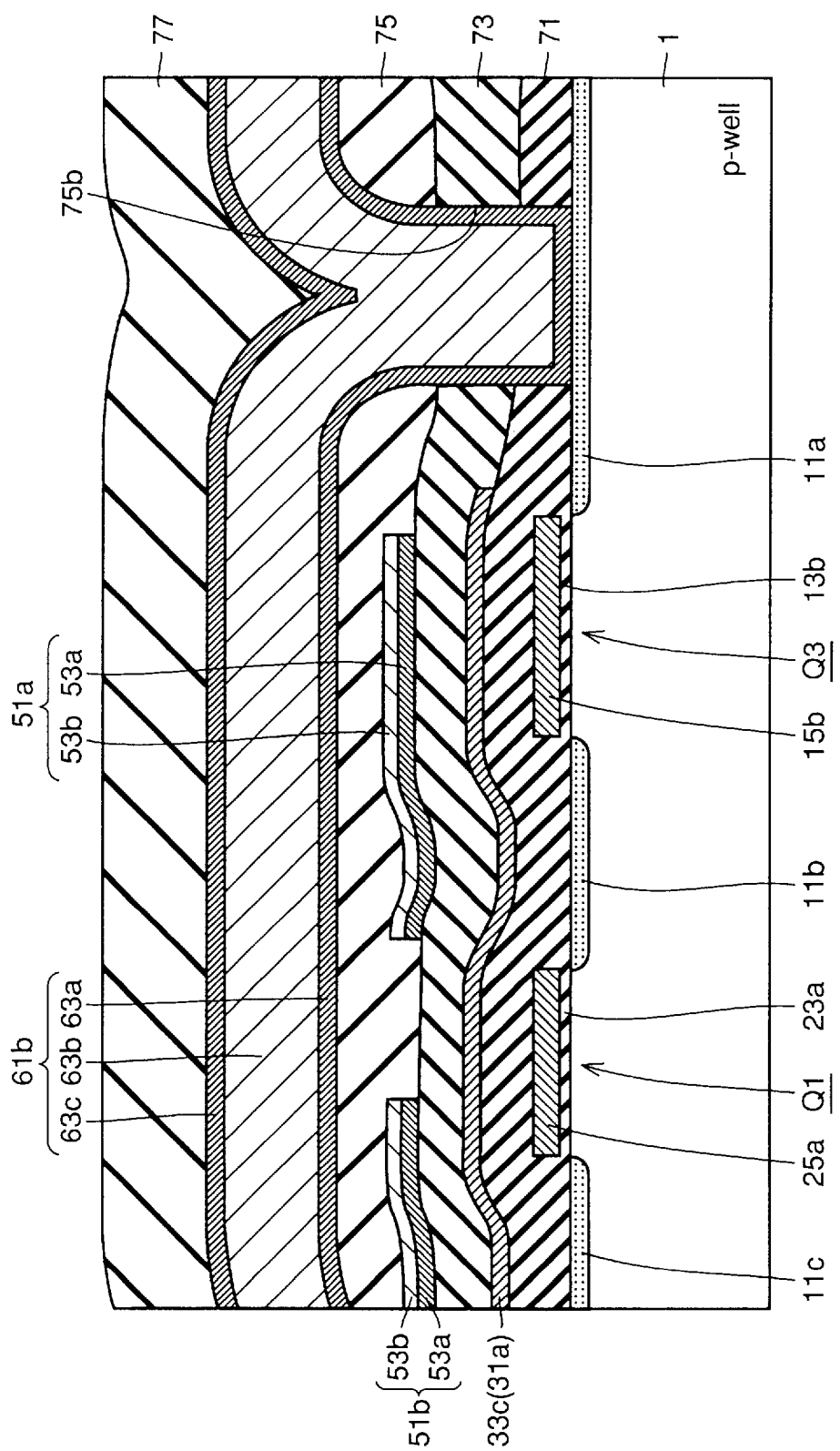
FIG. 2 is a sectional view schematically showing the SRAM memory cell structure according to the first embodiment of the invention.

FIG. 1 and FIG. 2 are sectional views taken along line A1—A1 and line B—B of FIG. 3 to FIG. 6.

Figure 3:
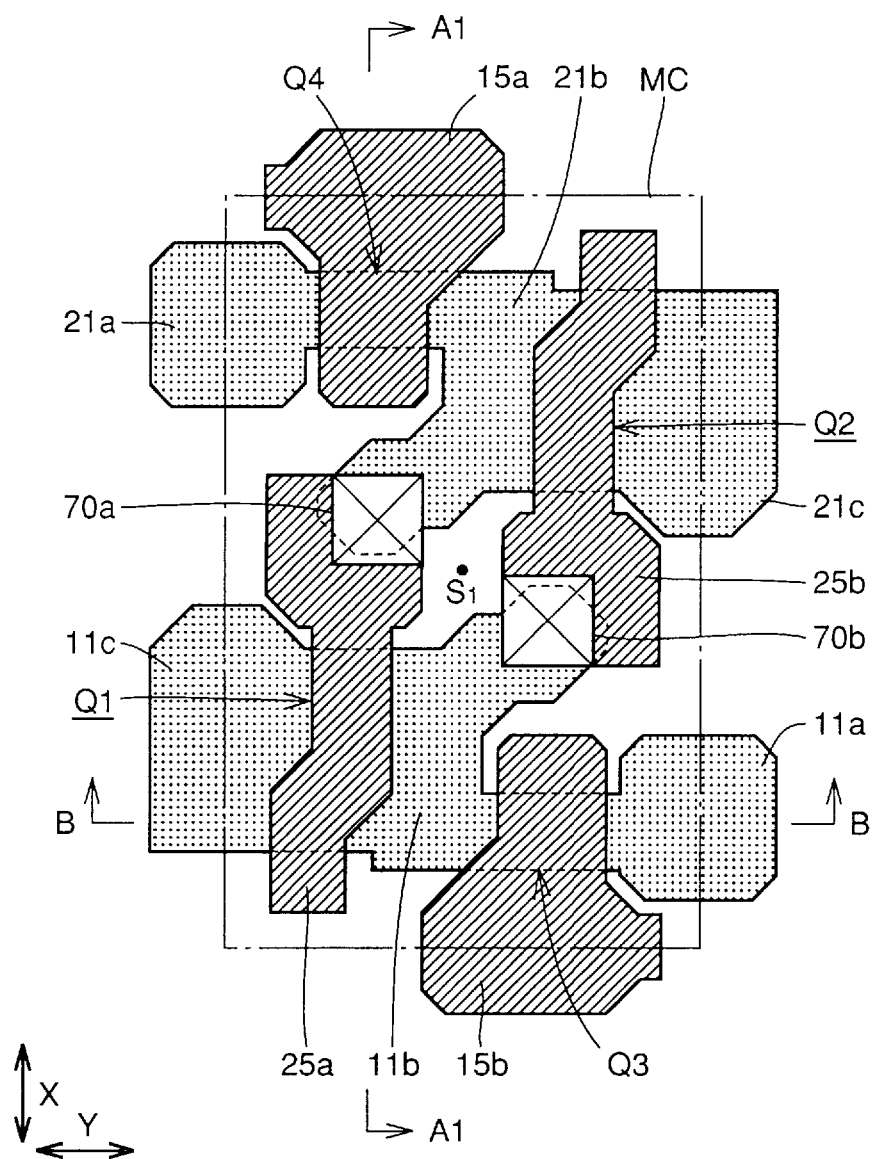
FIG. 3 to FIG. 6 are planar structural drawings showing four separated levels from the bottom up of the SRAM memory cell structure of the first embodiment of the invention.
Figure 4:
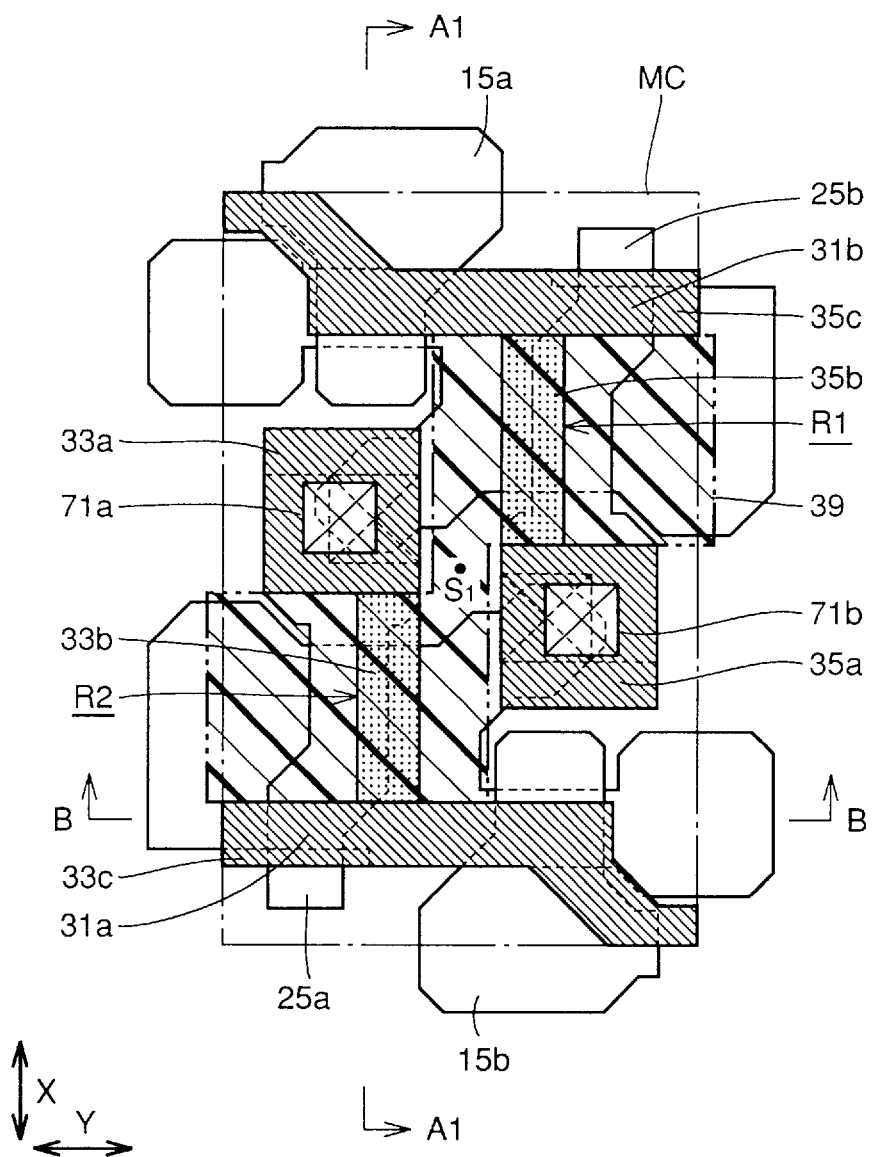
Figure 5:
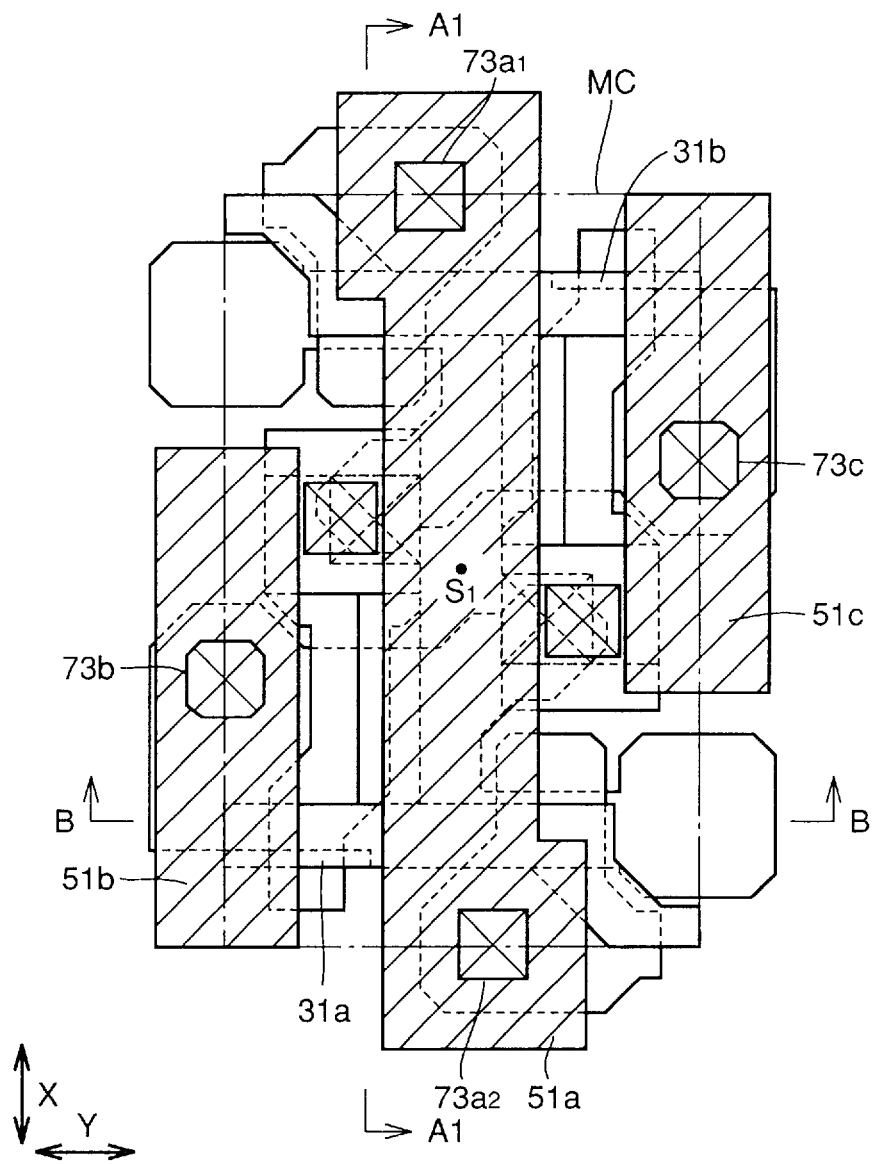
Figure 6:
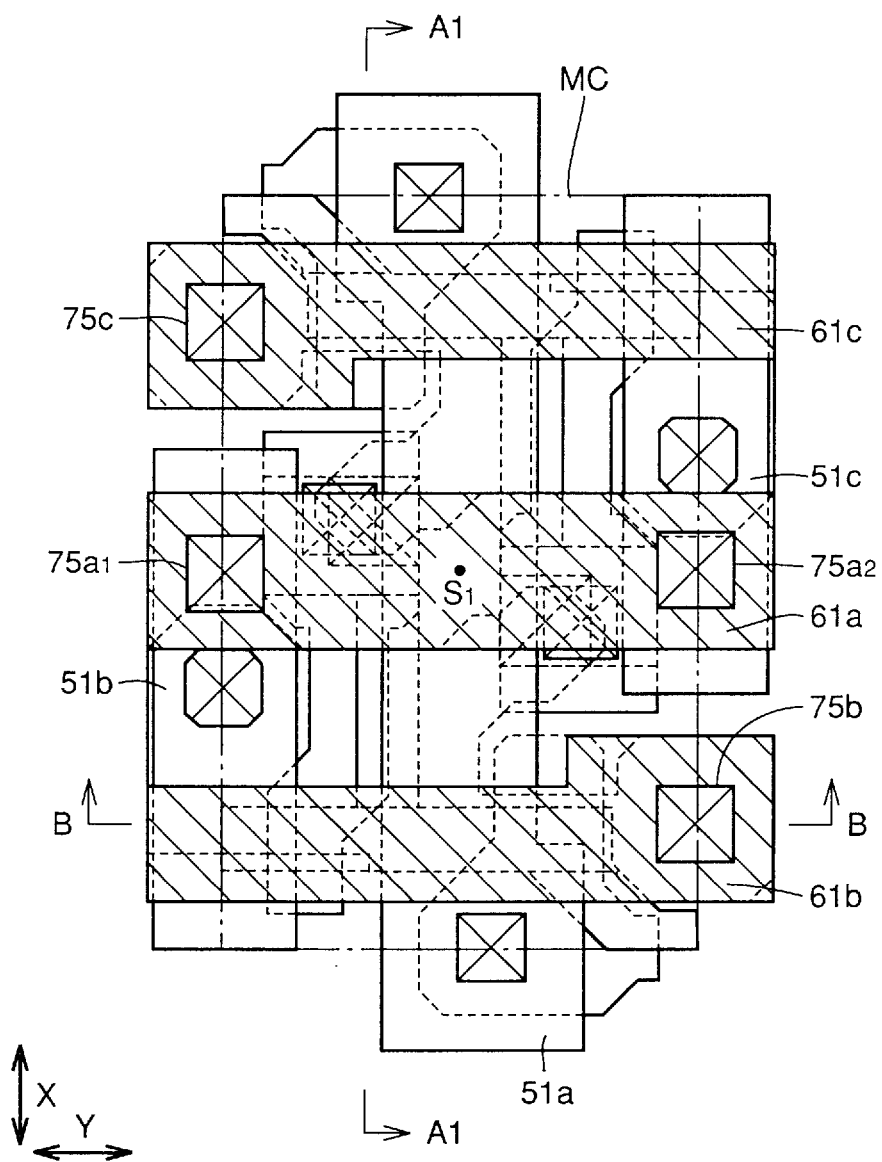

To be concrete, FIG. 3 shows structure of a pair of driver transistors Q1 and Q2 and a pair of access transistors Q3 and Q4 formed at a substrate. FIG. 4 shows structure of a pair of high resistances R1 and R2, FIG. 5 shows structure of a word line, and FIG. 6 shows structure of a bit line and a GND wiring layer.

Referring chiefly to FIG. 1 to FIG. 3, the region MC enclosed by the one-dot chain line (FIG. 3) is a region in which one memory cell is formed (hereinafter referred to as memory cell region). In the memory cell region MC, there are disposed the pair of the driver transistors Q1 and Q2, the pair of the access transistors Q3 and Q4, and the pair of the high resistances R1 and R2 (FIG. 4) forming an SRAM memory cell.

Referring chiefly to FIG. 2 and FIG. 3, the pair of the driver transistors Q1 and Q2 and the pair of the access transistors Q3 and Q4 are formed on the surface of a p-type well region formed at the semiconductor substrate. The driver transistor Q1 has a drain region $11b$, a source region $11c$, a gate insulating layer $23a$, and a gate electrode layer $25a$. The drain region $11b$ and the source region $11c$ are formed of an n-type diffused region and disposed a predetermined distance apart from each other in the direction of the arrow Y (direction of the column) to thereby define a channel region. The gate electrode layer $25a$ is formed elongated in the direction of the arrow X (direction of the row) so as to confront the channel region with the gate insulating layer $23a$ interposed therebetween.

The driver transistor Q2 has a drain region $21b$, a source region $21c$, a gate insulating layer (not shown), and a gate electrode layer $25b$. The drain region $21b$ and the source region $21c$ are formed of an n-type diffused region and disposed a predetermined distance apart from each other in the direction of the arrow Y to thereby define a channel region. The gate electrode layer $25b$ is formed elongated in the direction of the arrow X so as to confront the channel region with the gate insulating layer interposed therebetween.

The access transistor Q3 has a pair of source/drain regions $11a$ and $11b$, a gate insulating layer $13b$, and a gate electrode layer $15b$. The pair of the source/drain region $11a$ and $11b$ are formed of an n-type diffused region and disposed a predetermined distance apart from each other in the direction of the arrow Y to thereby define a channel region. The gate electrode layer $15b$ is formed in confrontation with the channel region with the gate insulating layer $13b$ interposed therebetween.

The access transistor Q4 has a pair of source/drain regions $21a$ and $21b$, a gate insulating layer (not shown), and a gate electrode layer $15a$. The pair of source/drain regions $21a$ and $21b$ are formed of an n-type diffused region and disposed a predetermined distance apart from each other in the direction of the arrow Y to thereby define a channel region. The gate electrode layer $15a$ is formed in confrontation with the channel region with the gate insulating layer interposed therebetween.

The gate electrode layers $15a$, $15b$, $25a$, and $25b$ are formed of the same layer, separately from each other. The gate electrode layers $15a$, $15b$, $25a$, and $25b$ are formed for example of a single layer of doped polycrystalline silicon and the sheet resistance of the same is around 40 $\Omega/\square$.

The drain region $11b$ of the driver transistor Q1 and the source/drain region $11b$ of the access transistor Q3 are formed of the same n-type diffused region. The drain region 21b of the driver transistor Q2 and the source/drain region 21b of the access transistor Q4 are formed of the same n-type diffused region.

The gate electrode layer 25a is kept in contact with the n-type diffused region 21b through a contact hole 70a formed in the gate insulating layer 23a. Further, the gate electrode layer 25b is electrically connected with the n-type diffused region 11b through a contact hole 70b formed in the gate insulating layer (not shown).

The planar layout structure of the pair of the driver transistors Q1 and Q2 and the pair of the access transistors Q3 and Q4 in the memory cell region MC has a symmetrical configuration about a point $S_1$ in the center.

Figure 7:
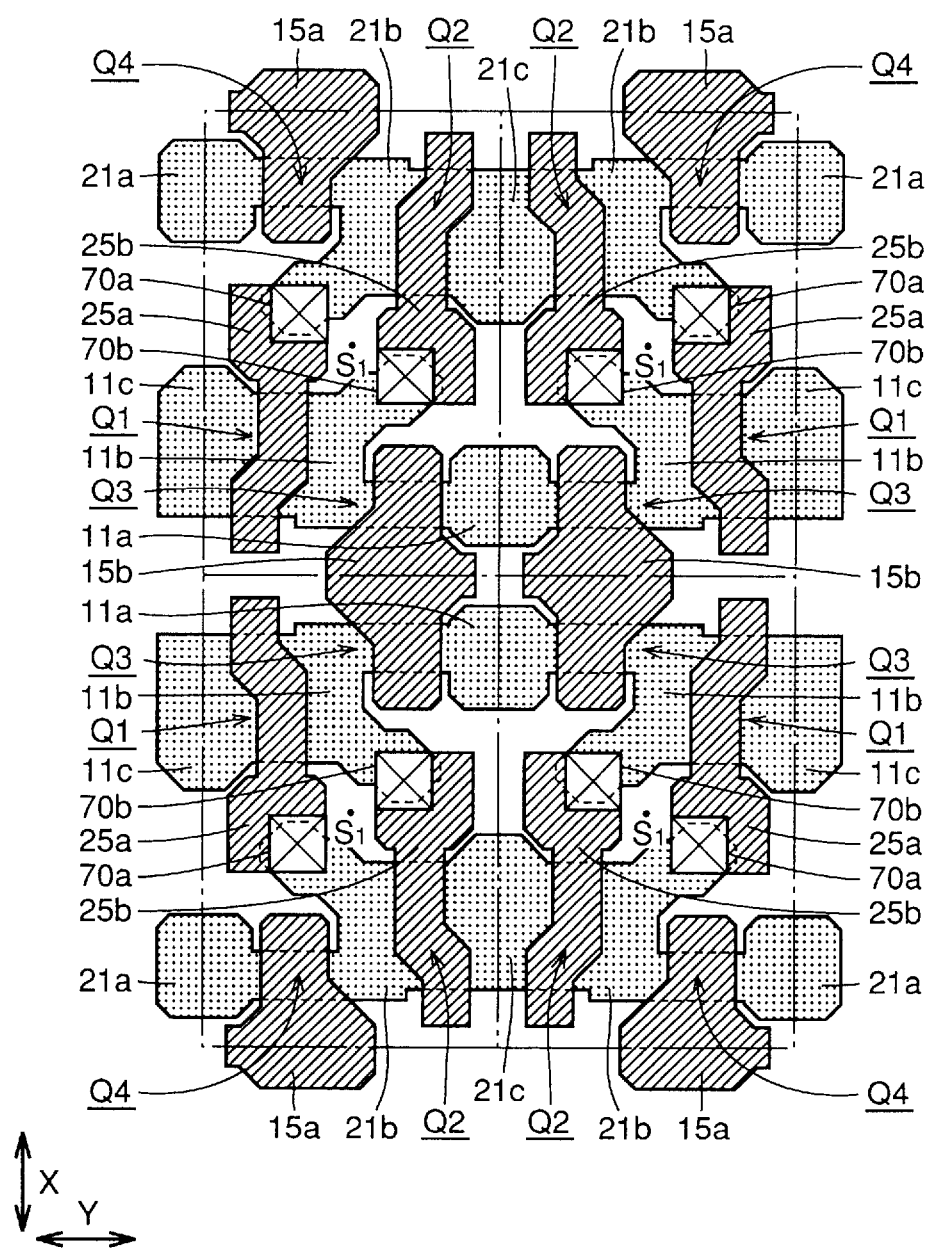
FIG. 7 to FIG. 10 are planar structural drawings showing four separated levels from the bottom up of a four-bit portion of the SRAM memory cell structure of the first embodiment of the invention.

Referring chiefly to FIG. 7, the source regions 11c, 11c of the driver transistors Q1, Q1 of the memory cells adjoining each other in the direction of the arrow Y (direction of the column) are integrally formed of the same n-type diffused region. It is the same with the structure of the source region 21c of the driver transistor Q2 as with the structure of the source region 11c of the driver transistor Q1.

The source/drain regions 11a, 11a of the access transistors Q3, Q3 of the memory cells adjoining each other in the direction of the arrow Y (direction of the column) are integrally formed of the same n-type diffused region. It is the same with the structure of the source/drain region 21a of the driver transistor Q4 as with the structure of the source/drain region 11a of the access transistor Q3.

Further, the gate electrode layers 15b, 15b of the access transistors Q3, Q3 of the memory cells adjoining each other in the direction of the arrow X (direction of the row) are integrally formed of the same conducting layer. It is the same with the structure of the gate electrode layer 15a of the access transistor Q4 as with the structure of the gate electrode layer 15b of the access transistor Q3.

The layout structures of the driver transistors Q1 and Q2, and the access transistors Q3 and Q4 of the memory cells adjoining each other in the direction of the arrow Y have a symmetrical configuration about a line, respectively. The layout structures of the driver transistors Q1 and Q2, and the access transistors Q3 and Q4 of the memory cells adjoining each other in the direction of the arrow X also have a symmetrical configuration about a line, respectively.

Referring chiefly to FIG. 1, FIG. 2, and FIG. 4, there is formed an insulating layer 71 to cover the pair of the driver transistors Q1 and Q2 and the pair of the access transistors Q3 and Q4. The insulating layer 71 has contact holes 71a and 71b formed therein.

There is formed a resistance layer 31a in contact with the gate electrode layer 25a of the driver transistor Q1 through the contact hole 71a. There is further formed a resistance layer 31b in contact with the gate electrode layer 25b of the driver transistor Q2 through the contact hole 71b.

The resistance layer 31a has a high resistance region 33b with a relatively high resistance value and low resistance regions 33a and 33c with relatively low resistance values. The low resistance region 33a is disposed at the portion to be connected with the gate electrode layer 25a through the contact hole 71a. The high resistance region 33b, which constitutes a high resistance R2, is stretched in the direction of the arrow X and has its one end connected with the low resistance region 33a. The low resistance region 33c is connected with the other end of the high resistance region 33b and stretched in the direction of the arrow Y.

The resistance layer 31b has a high resistance region 35b with a relatively high resistance value and low resistance regions 35a and 35c with relatively low resistance values. The low resistance region 35a is disposed at the portion to be connected with the gate electrode layer 25b through the contact hole 71b. The high resistance region 35b, which constitutes a high resistance R1, is stretched in the direction of the arrow X and has its one end connected with the low resistance region 35a. The low resistance region 35c is connected with the other end of the high resistance region 35b and stretched in the direction of the arrow Y.

The resistance layers 31a and 31b are formed by injecting p-type impurities into a polycrystalline silicon layer patterned with a mask of photoresist or the like provided in the region 39 enclosed by the two-dot chain line. Namely, the regions having the impurities injected therein become the low resistance regions 33a, 33c, 35a, and 35c and the regions free from the injection become the high resistance regions 33b and 35b.

The low resistance regions 33c and 35c are used for the Vcc wirings.

The planar layout structure of the pair of high resistances R1 and R2 has a symmetrical configuration about the point $S_1$ in the center.

Figure 8:
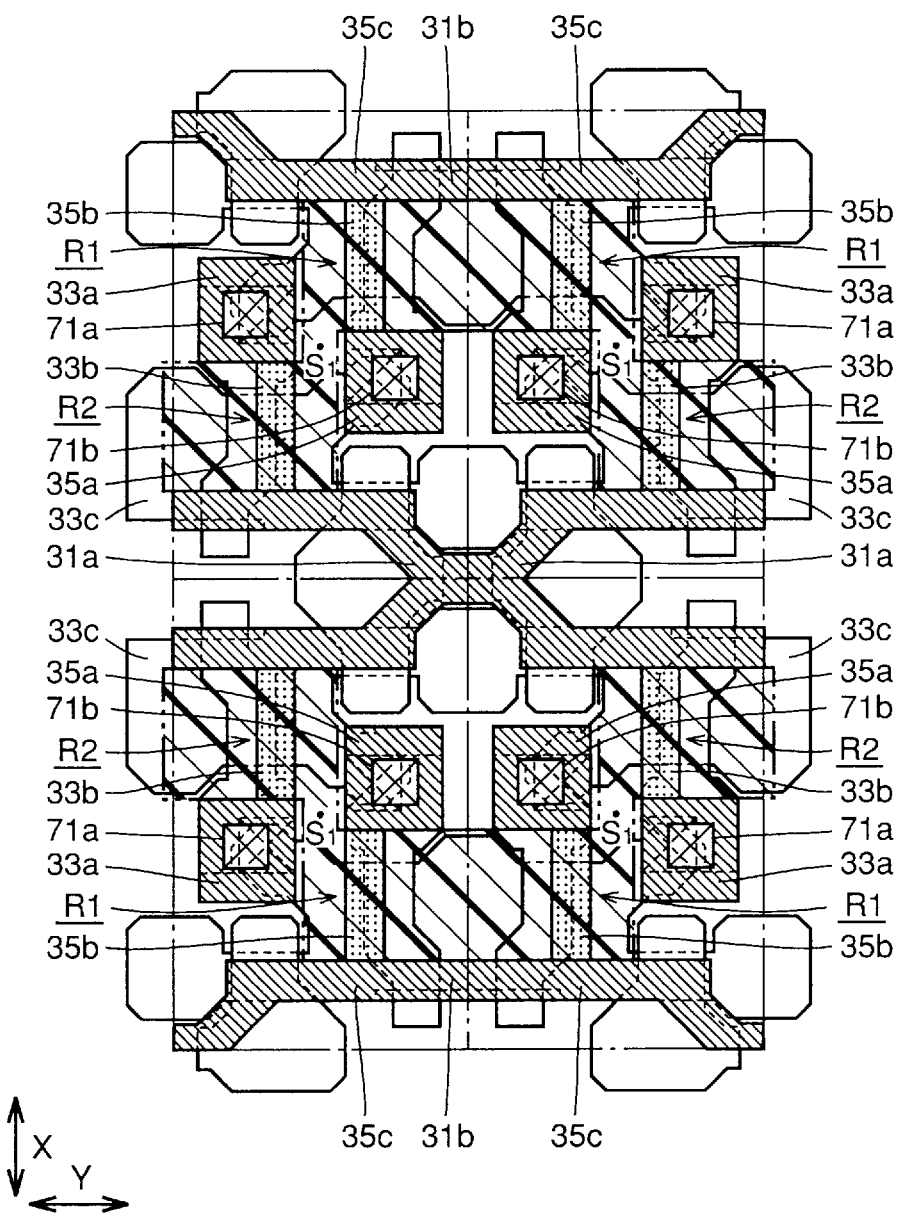

Referring chiefly to FIG. 8, the low resistance regions 35c, 35c of the high resistances R1, R1 of the memory cells adjoining each other in the direction of the arrow Y (direction of the column) are integrally formed of the same conducting layer. It is the same with the structure of the low resistance region 31a of the high resistance R2 as with the structure of the low resistance region 35c of the high resistance R1.

The low resistance regions 35c, 35c of the high resistance R1, R1 of the memory cells adjoining each other in the direction of the arrow X (direction of the row) are integrally formed of the same conducting layer. It is the same with the structure of the low resistance region 31a of the high resistance R2 as with the structure of the low resistance region 35c of the high resistance R1.

The layout structures of the high resistances R1 and R2 of the memory cells adjoining each other in the direction of the arrow Y have a symmetrical configuration about a line, respectively. The layout structures of the high resistance R1 and R2 of the memory cells adjoining each other in the direction of the arrow X also have a symmetrical configuration about a line, respectively.

Referring chiefly to FIG. 1, FIG. 2, and FIG. 5, there is formed an insulating layer 73 to cover the resistance layers 31a and 31b. The insulating layer 73 has contact holes $73a_1$, $73a_2$, 73b, and 73c formed therein.

There is formed a conducting layer 51a in contact with the gate electrode layer 15a of the access transistor Q4 through the contact hole $73a_1$, and also in contact with the gate electrode layer 15b of the access transistor Q3 through the contact hole $73a_2$. The conducting layer 51a is stretched straightly in the direction of the arrow X so as to longitudinally cut through the memory cell region MC and is used for the word line.

There is formed a conducting layer 51b in contact with the source region 11c of the driver transistor Q1 through the contact hole 73b. Further, there is formed a conducting layer 51c in contact with the source region 21c of the driver transistor Q2 through the contact hole 73c. The conducting layers 51b and 51c are both stretched in the direction of the arrow X and are used for electrode pads for connection with the GND wiring.

The conducting layers 51a, 51b, and 51c are each formed of a compound layer of a doped polycrystalline silicon layer 53a and a high melting point silicide layer 53b and the sheet resistance of the same is around 5–15 Ω/□.

The planar layout structure of the conducting layers 51a, 51b, and 51c has a symmetrical configuration about the point $S_1$ in the center.

Figure 9:
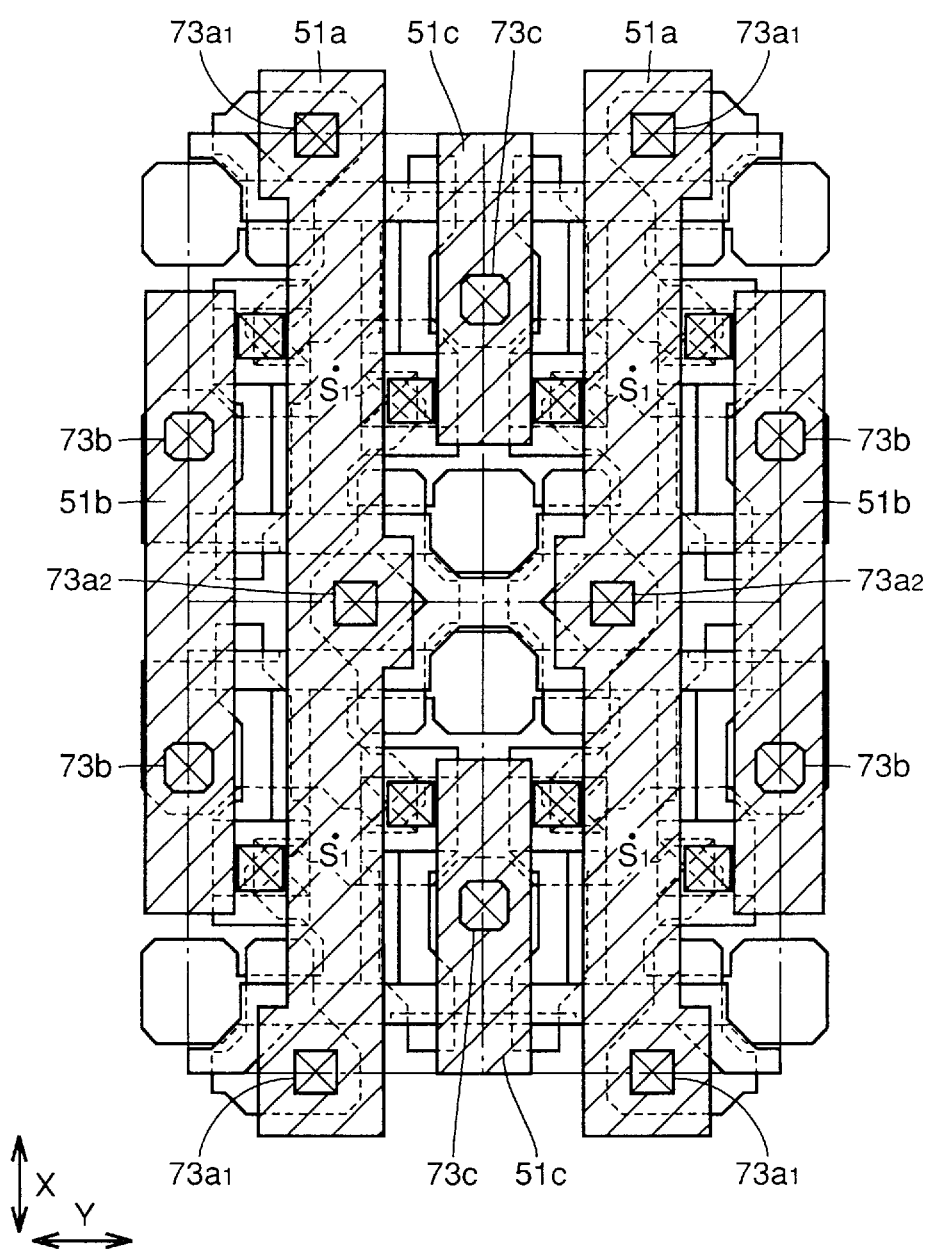

Referring chiefly to FIG. 9, the conducting layers 51b, 51b of the memory cells adjoining each other in the direction of the arrow Y are integrally formed. The conducting layers 51b, 51b of the memory cells adjoining each other in the direction of the arrow X are also integrally formed of the same conducting layer. It is the same with the structure of the conducting layer 51c as with the structure of the conducting layer 51b.

Further, the conducting layers 51a, 51a in the memory cells adjoining each other in the direction of the arrow X are integrally formed and arranged to longitudinally cut through the memory cell regions MC one after the other.

The layout structures of the conducting layers 51a, 51b, and 51c of the memory cells adjoining each other in the direction of the row have a symmetrical configuration about a line, respectively. The layout structures of the conducting layers 51a, 51b, and 51c of the memory cells adjoining each other in the direction of the arrow Y also have a symmetrical configuration about a line, respectively.

Referring chiefly to FIG. 1, FIG. 2, and FIG. 6, there is formed an insulating layer 75 to cover the conducting layers 51a, 51b, and 51c. The insulating layer has contact holes $75a_1$, $75a_2$, 75b, and 75c formed therein.

There is formed a wiring layer 61a in contact with the conducting layer 51b through the contact hole $75a_1$, and also in contact with the conducting layer 51c through the contact hole $75a_2$. The wiring layer 61a is stretched straightly in the direction of the arrow Y so as to laterally cut through the memory cell region MC.

There is formed a wiring layer 61b in contact with the source/drain region 11a of the access transistor Q3 through the contact hole 75b. Further, there is formed a wiring layer 61c in contact with the source/drain region 21a of the access transistor Q4 through the contact hole 75c. The wiring layers 61b and 61c are stretched straightly in the direction of the arrow Y so as to laterally cut through the memory cell region MC.

The wiring layers 61a, 61b, and 61c have a laminated structure of a TiN layer 63a, an Al—Si—Cu layer 63b, and a TiN layer 63c and the sheet resistance of the same is around 50 mΩ/□.

The wiring layer 61a is used for the GND wiring and the wiring layers 61b and 61c are used for the bit lines.

The planar layout structure of the GND wiring 61a and the bit lines 61b and 61c in the memory cell region MC has a symmetrical configuration about the point $S_1$ in the center.

Figure 10:
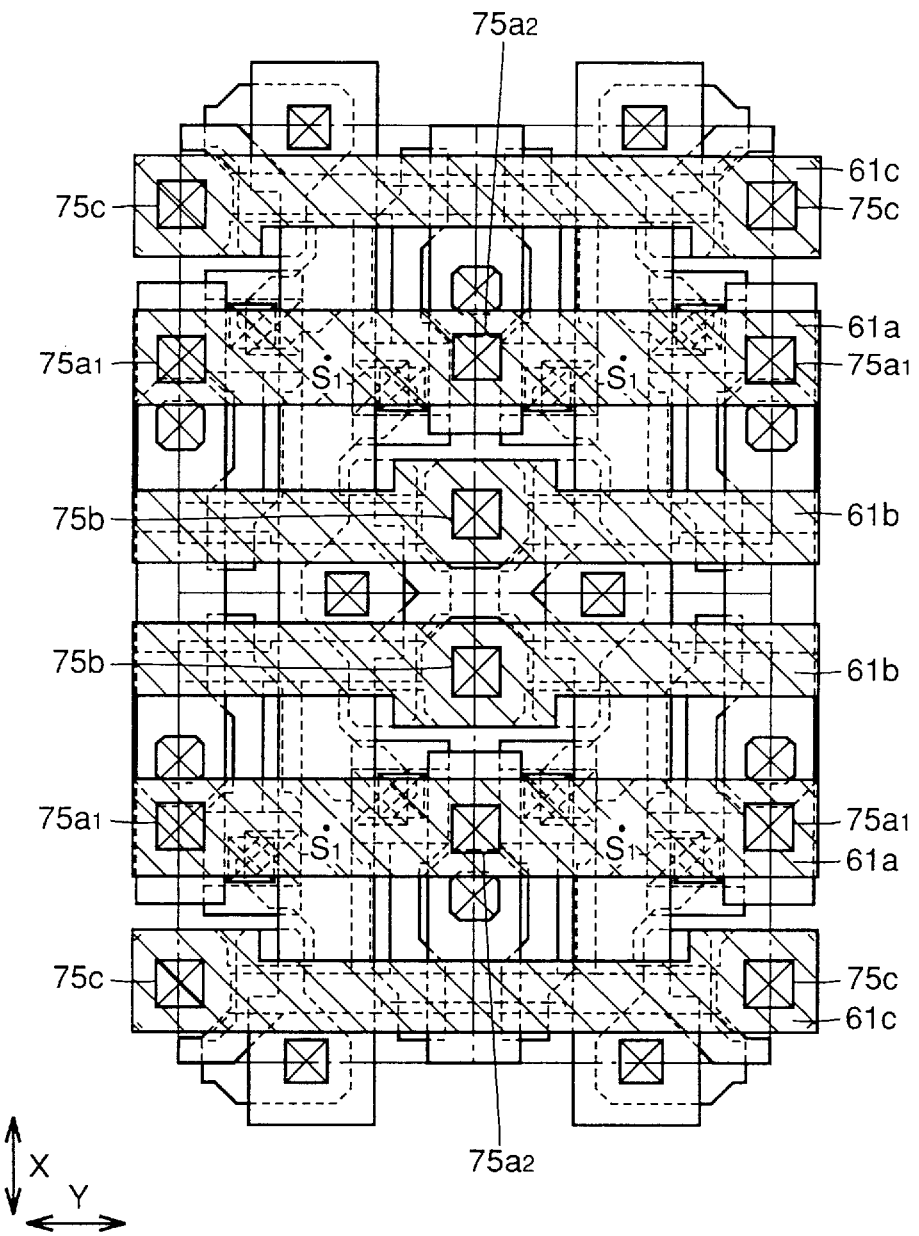

Referring chiefly to FIG. 10, the GND wirings 61a, 61a and the bit lines 61b, 61b and 61c, 61c of the memory cells adjoining each other in the direction of the arrow Y are integrally formed. Namely, the GND wirings 61a and the bit lines 61b and 61c cut laterally and straightly through the memory cell regions MC arranged in the direction of the arrow Y, one after the other.

The planar layout structures of the GND wirings 6la and the bit lines 61b and 61c of the memory cells adjoining each other in the direction of the arrow Y have a symmetrical configuration about a line, respectively. Also, the planar layout structures of the GND wirings 61a and the bit lines 61b and 61c of the memory cells adjoining each other in the direction of the arrow X have a symmetrical configuration about a line, respectively.

There is formed for example a passivation layer 77 to cover the GND wirings 61a and the bit lines 61b and 61c.

In the SRAM memory cell structure of the embodiment, as shown in FIG. 3 and FIG. 5, the word line 51a is formed on a layer different from the gate electrode layers 15b and 15a of the access transistors Q3 and Q4. Therefore, the gate electrode layers 15a and 15b of the access transistors Q3 and Q4 are only required to be disposed at the positions confronting the channel regions of the access transistors Q3 and Q4. Accordingly, it becomes unnecessary to stretch the gate electrode layers 15a and 15b of the access transistors Q3 and Q4 so that they laterally cut through the memory cell and, hence, the area within the memory cell occupied by the gate electrode layers 15a and 15b can be reduced. Therefore, the planar layout area of the memory cell can be reduced correspondingly to the reduction in area of the gate electrode layers 15a and 15b.

Further, since the planar area occupied by the gate electrode layers 15b and 15a of the access transistors Q3 and Q4 is reduced, the degree of freedom of arrangement of the gate electrode layers 25a and 25b of the driver transistors Q1 and Q2 formed on the same layer as the gate electrode layers 15b and 15a can be extended. Also in this regard, the planar layout area of the memory cell can be reduced.

Further, as shown in FIG. 4 to FIG. 6, the word line 51a and the GND wiring layer 61a are provided over the resistance layers 31a and 31b. Accordingly, the planar layout of the word line 51a and the GND wiring layer 61a are not subject to restrictions due to the contact holes 71a and 71b for connecting the resistance layers 31a and 31b with the transistors provided on the layer under the same. Accordingly, the degree of freedom of arrangement of the GND wiring layer 61a and the word line 51a can be extended.

Figure 30:
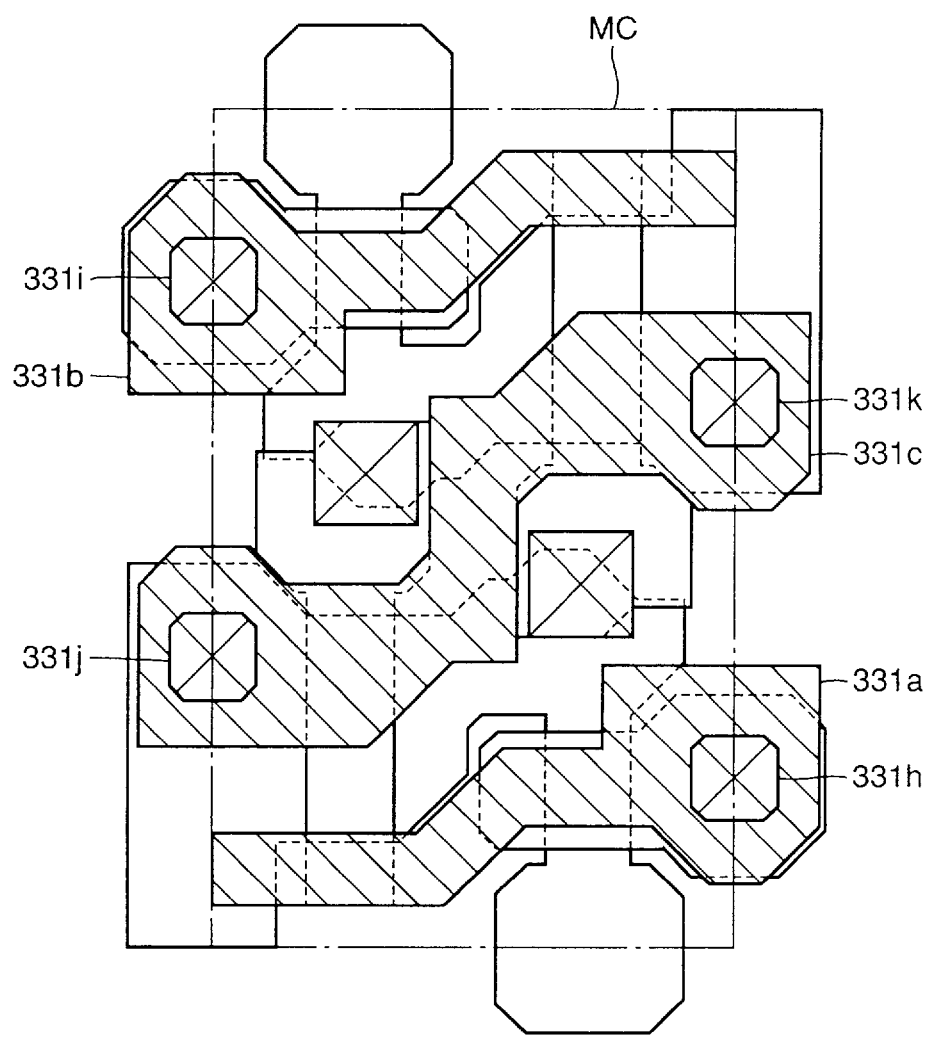
Figure 31:
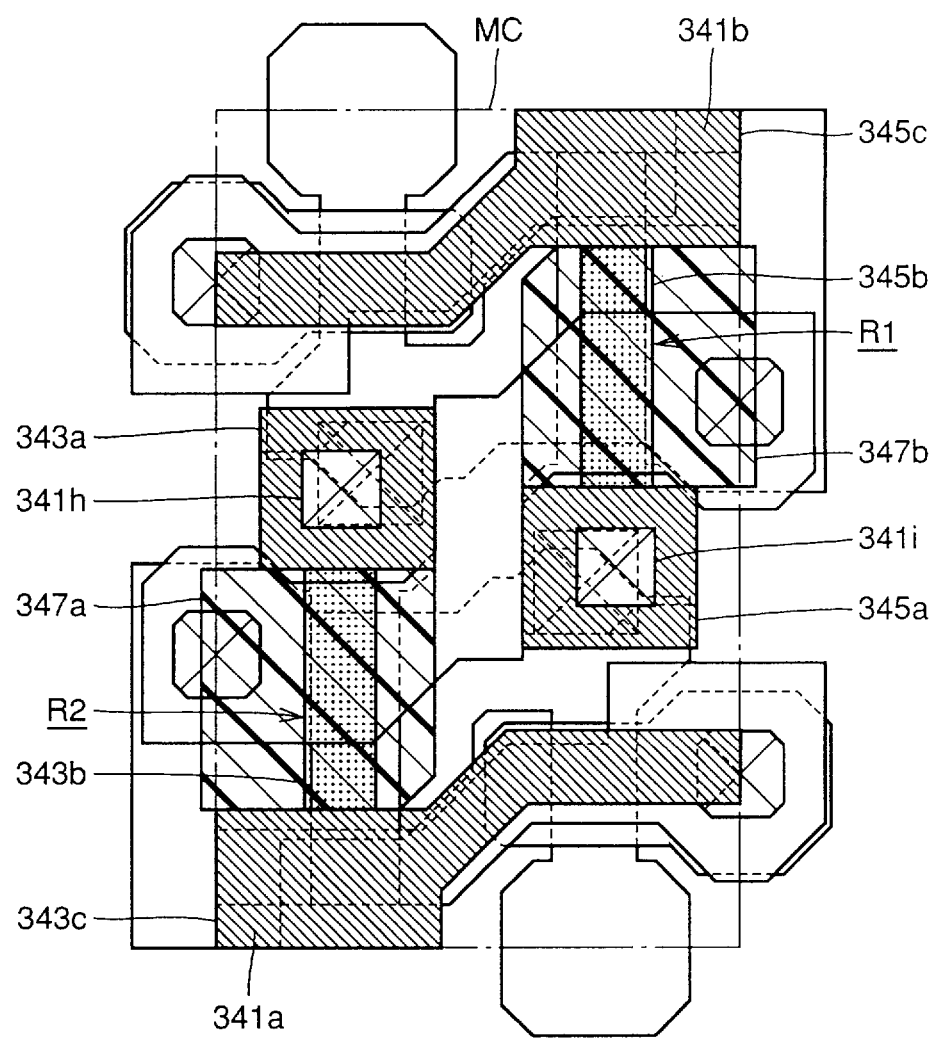
Figure 32:
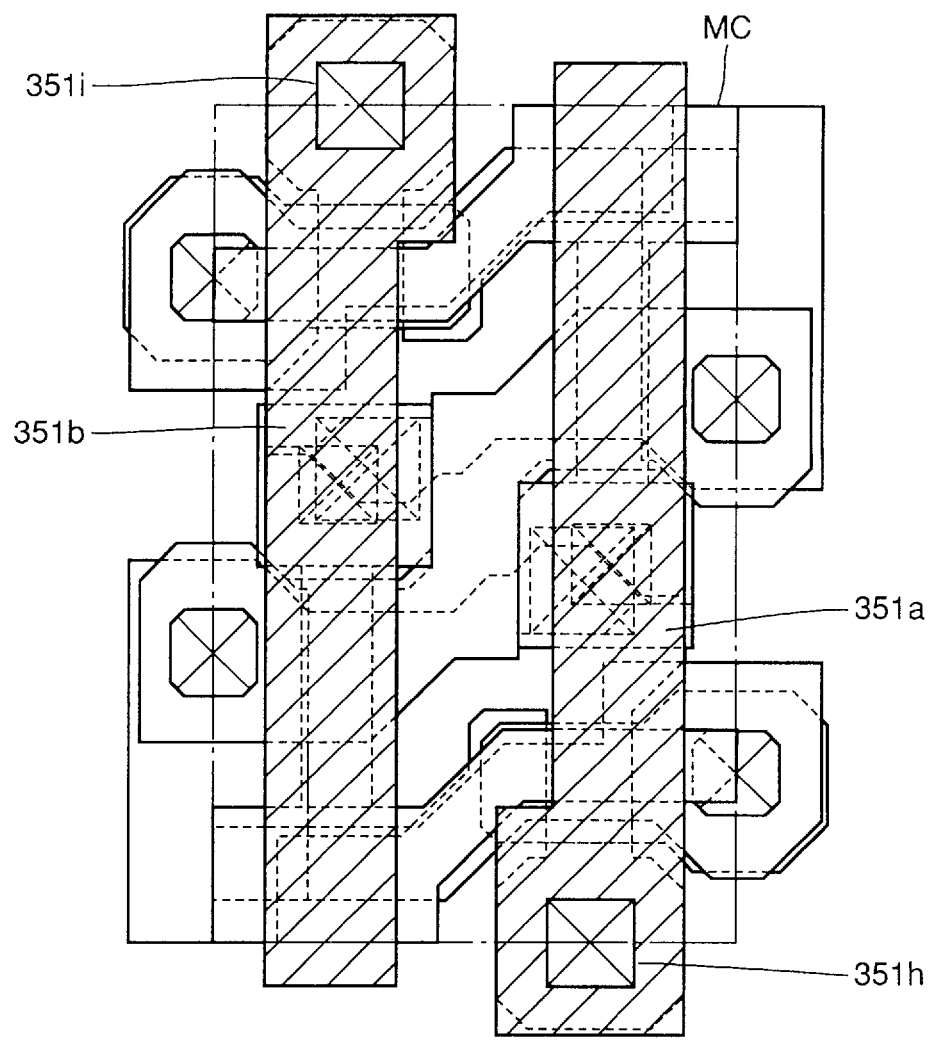
Figure 33:
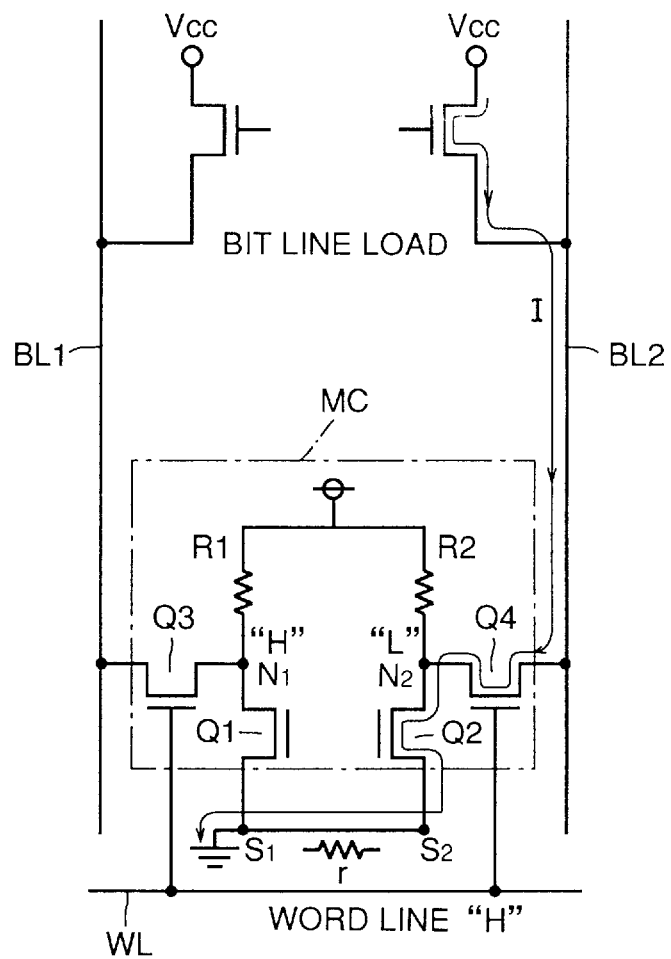
FIG. 33 is a circuit diagram of a memory cell explanatory of a column current flowing through an SRAM memory cell.

Especially, the GND wiring layer 61a can be provided with a larger line width and a simpler and shorter line path than the GND wiring 331c shown in FIG. 30. Therefore, the wiring resistance of the GND wiring layer 61a can be reduced and, accordingly, destruction of stored data or inversion of data when it is read can be prevented and stabilized operations of the memory can be realized.

Further, as shown in FIG. 5 and FIG. 6, the GND wiring layer 61a is provided over the layer on which the word line 51a is formed. Therefore, the GND wiring layer 61a can be made of a material, such as aluminum (Al), having a lower melting point than the material forming the word line 51a. Since aluminum is a material having extremely lower resistance than doped polycrystalline silicon, the wiring resistance of the GND wiring layer can be made still lower by using a material containing aluminum as the GND wiring layer 61a. Accordingly, an SRAM memory cell structure capable of still more stabilized operation can be obtained.

As shown in FIG. 5 and FIG. 6, the GND wiring layer 61a is connected with the transistors on the layer under the same by the pad electrode layer 51b and 51c interposed therebetween. The pad electrodes 51b and 51c are stretched in the direction of the arrow X as described above. By the provision of the pad electrodes 51b and 51c, the degree of freedom of planar layout of the contact holes $75a_1$, and $75a_2$ for connecting the GND wiring layer 61a to the transistors on the layer under the same can be extended. Therefore, it is made possible to stretch the GND wiring layer 61a straightly in the direction of the arrow Y and, further, to form it on the same layer on which the bit lines 61b and 61c are formed.

In the present embodiment, there are provided the pad electrode layers 51b and 51c for connecting the GND wiring layer 61a to the transistors on the layer under the same. In this invention, however, the pad electrode layers 51b and 51c are not absolutely necessary but the GND wiring layer 61a may be directly connected to the transistors on the layer under the same. In such a case, the planar layout structure of the source region 11c of the driver transistor Q1 and the source region 21c of the driver transistor Q2 may somewhat differ from that shown in FIG. 3.

Further, in the embodiment, a structure using the high resistances R1 and R2 as the load elements has been described, but load transistors Q5 and Q6 may be used as the load elements. Structures in which load transistors are used as the load elements will be described below as embodiments 2 to 5.

Embodiment 2

Figure 11:
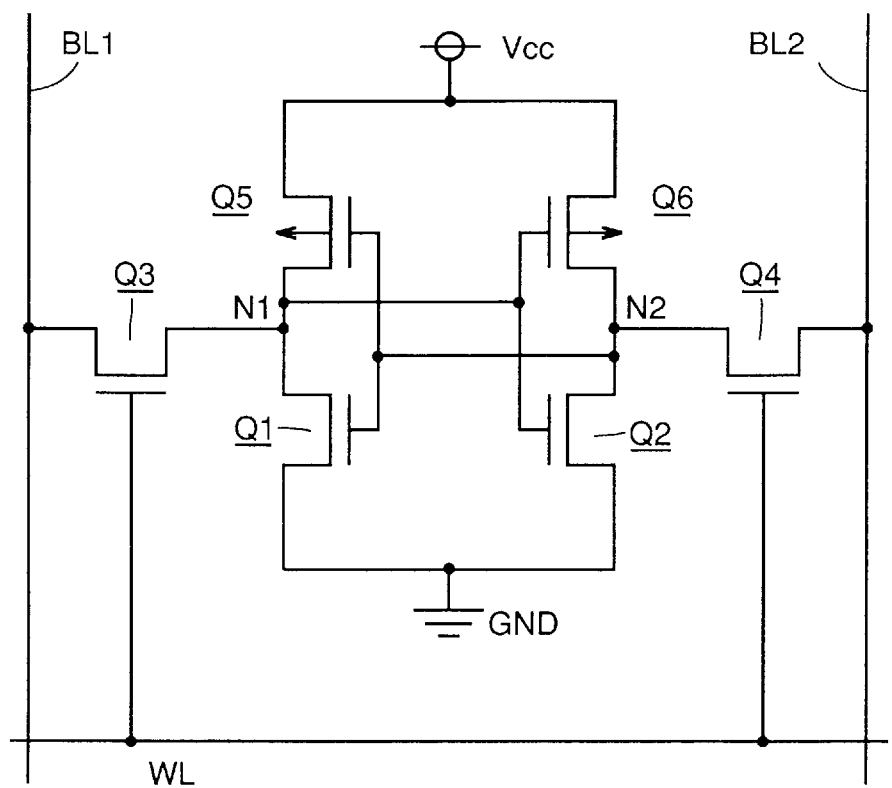
FIG. 11 is a transparent circuit diagram showing an SRAM memory cell structure using a load transistor as the load element.
Figure 28:
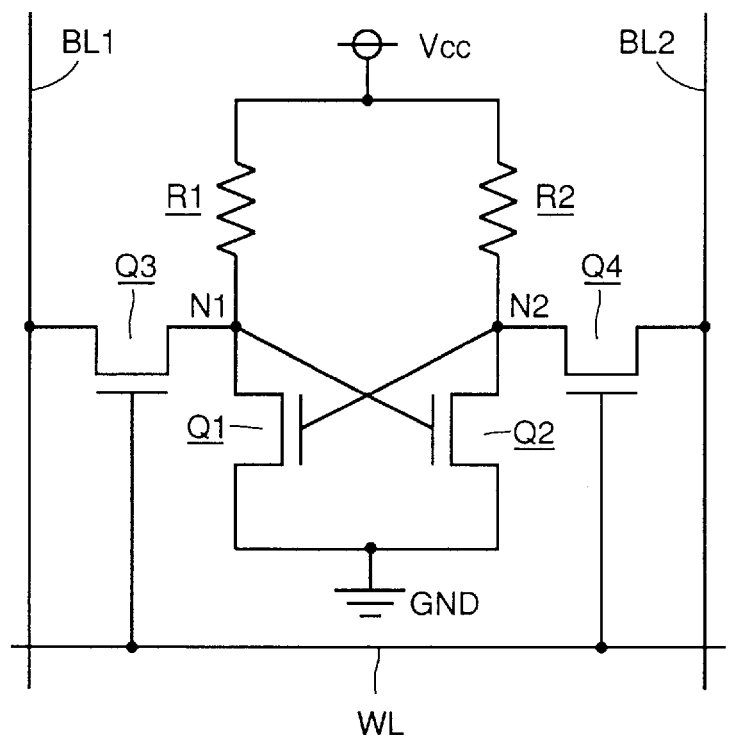
FIG. 28 is a transparent circuit diagram showing a general SRAM memory cell structure using a high resistance as the load element.
Figure 29:
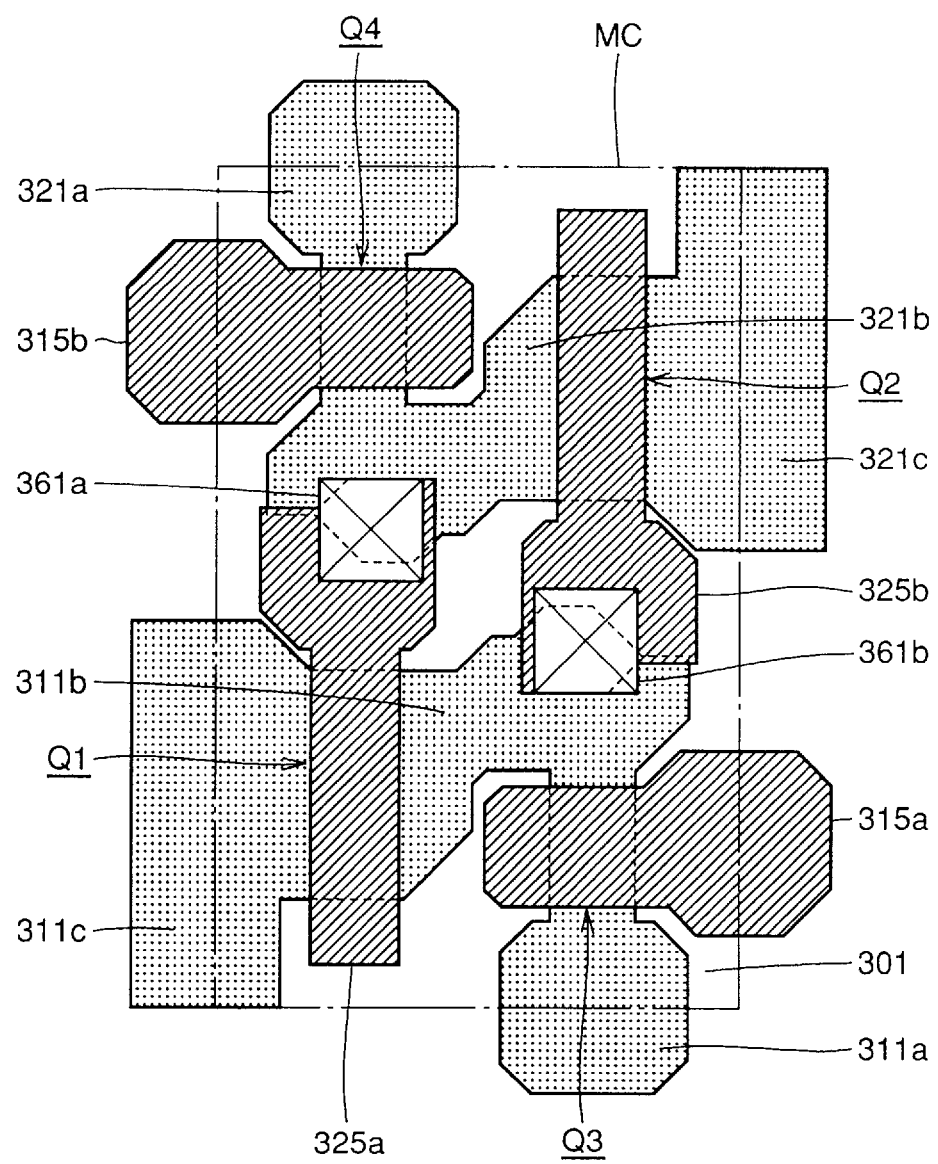
FIG. 29 to FIG. 32 are planar structural drawings showing four separated levels from the bottom up of a conventional SRAM memory cell structure.

Referring to FIG. 11, the equivalent circuit diagram is different from the equivalent circuit diagram shown in FIG. 28 in that load transistors Q5 and Q6 are used as the load elements.

The load transistors Q5 and Q6 are pMOS transistors. The source regions of the load transistors Q5 and Q6 are connected with the Vcc supply source, and their drain regions are connected with memory nodes N1 and N2, respectively. The gate of the load transistor Q5 is connected with the gate of the driver transistor Q1 and the drain region of the driver transistor Q2. Further, the gate of the load transistor Q6 is connected with the gate of the driver transistor Q2 and the drain region of the driver transistor Q1.

Particulars of the structure other than those described above are virtually the same as those of the structure of the equivalent circuit diagram shown in FIG. 28 and, therefore, description of the same will be omitted.

Figure 12:
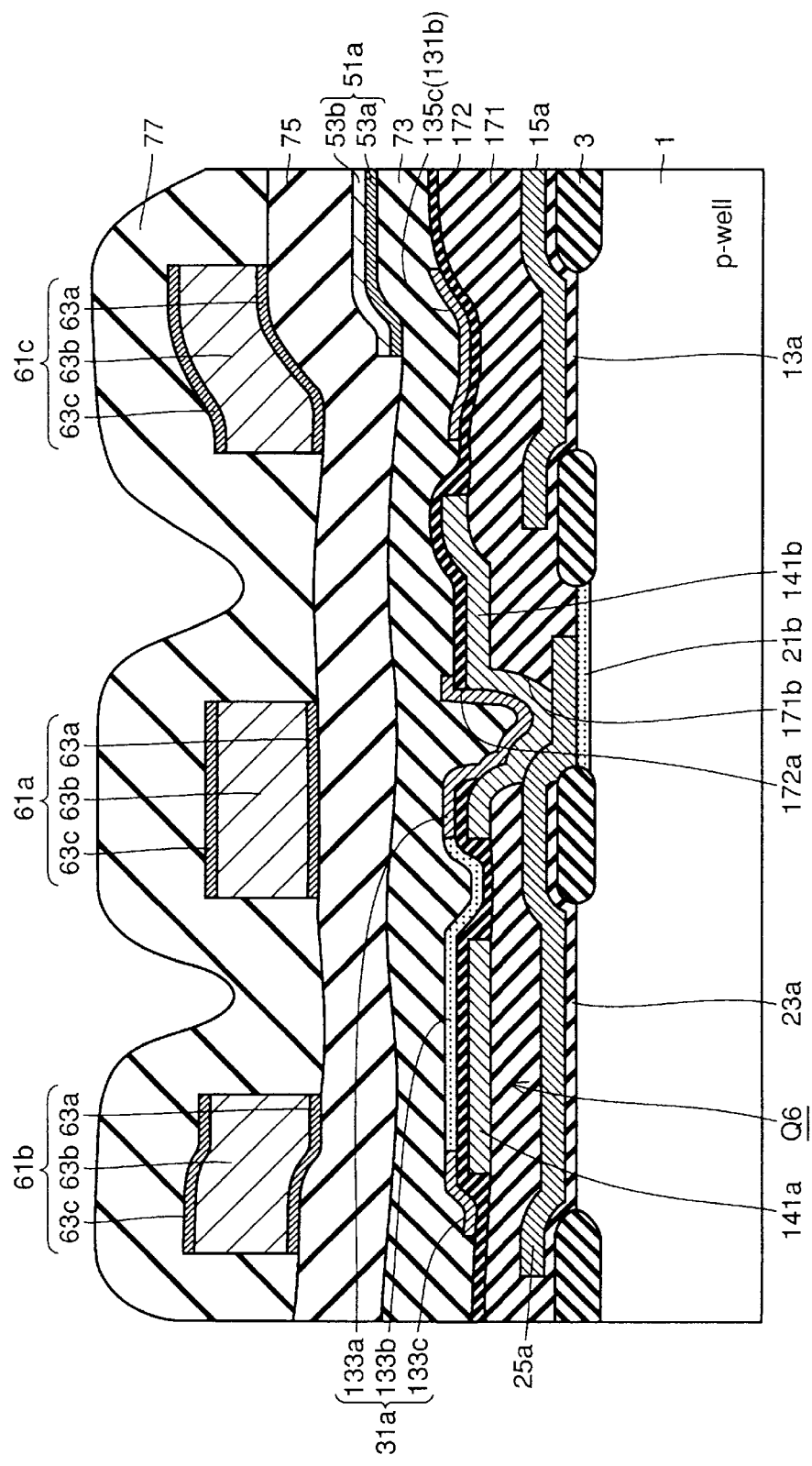
FIG. 12 is a sectional view schematically showing an SRAM memory cell structure according to a second embodiment of the invention.
Figure 13:
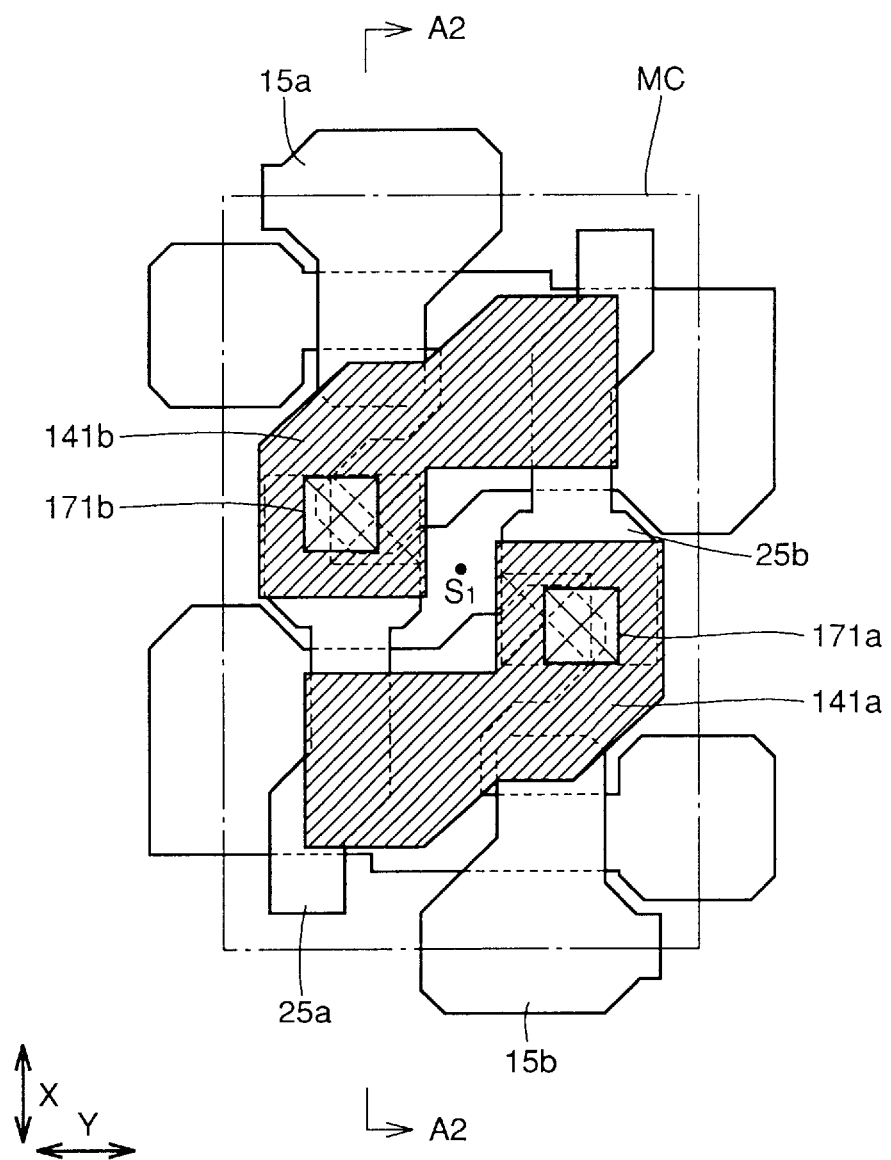
FIG. 13 to FIG. 16 are planar structural drawings showing four separated levels from the bottom up of the SRAM memory cell structure of the second embodiment of the invention.

FIG. 12 is a sectional view taken along line A2—A2 of FIG. 13 to FIG. 16.

The SRAM memory cell of the present embodiment has a bottom gate type TFT (Thin Film Transistor) as the load element. In the SRAM memory cell structure of the embodiment, the structures of the pair of the driver transistors Q1 and Q2 and the pair of the access transistors Q3 and Q4 are virtually the same as the structure of embodiment 1 shown in FIG. 3 and, therefore, description of the same will be omitted.

Figure 14:
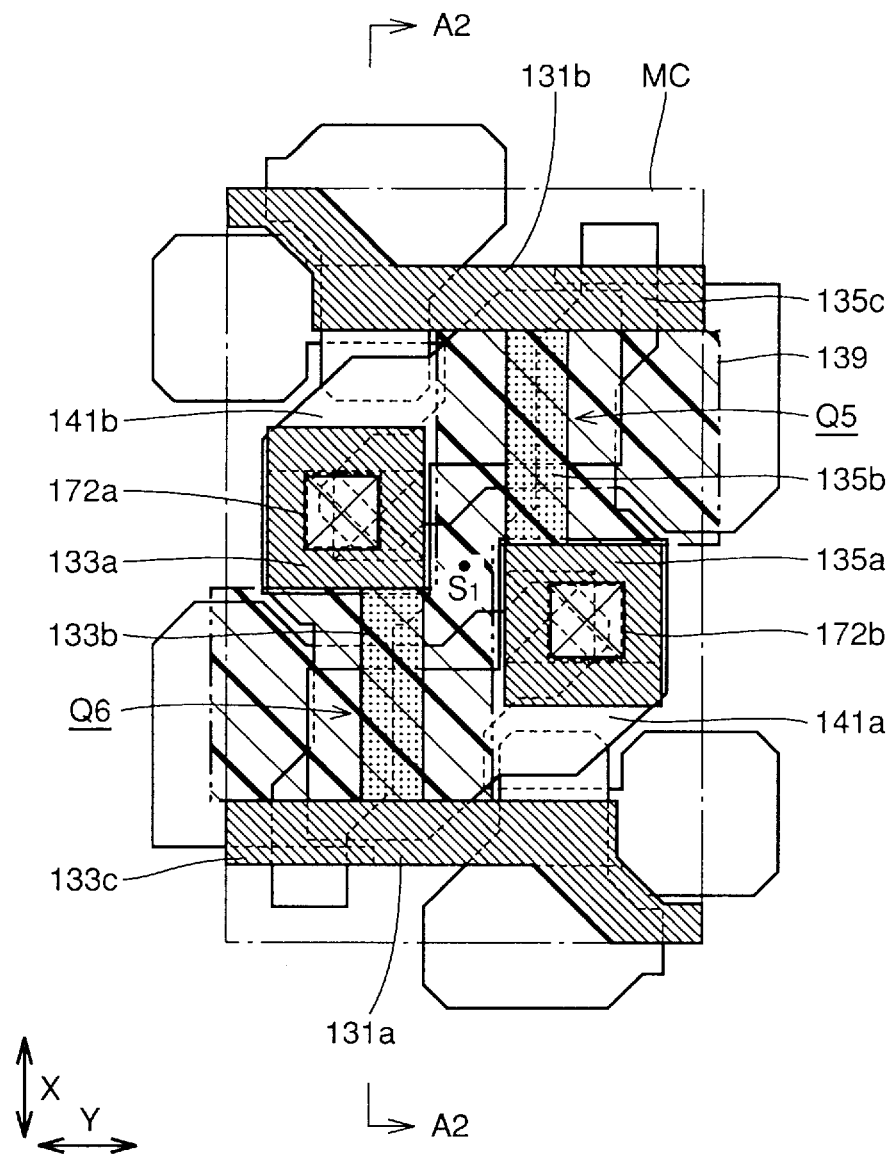

Referring chiefly to FIG. 12 and FIG. 14, there is formed an insulating layer 171 to cover the pair of the driver transistors Q1 and Q2 and the pair of the access transistors Q3 and Q4. The insulating layer 171 has contact holes 171a and 171b formed therein.

There is formed a gate electrode layer 141a in contact with the gate electrode layer 25b of the driver transistor Q2 through the contact hole 171a. Further, there is formed a gate electrode layer 141b in contact with the gate electrode layer 25a of the driver transistor Q1 through the contact hole 171b.

The planar layout structure of the gate electrode layers 141a and 141b has a symmetrical configuration about the point $S_1$ in the center.

Referring chiefly to FIG. 12 and FIG. 14, there is formed a thin insulating layer 172 so as to cover the gate electrode layers 141a and 141b. The thin insulating layer 172 has contact holes 172a and 172b formed therein.

There is formed a semiconductor layer 131a in contact with the gate electrode layer 141b through the contact hole 172a. Further, there is formed a semiconductor layer 131b in contact with the gate electrode layer 141a through the contact hole 172b. The gate electrode layer 141b and the semiconductor layer 131b form the load transistor Q5 and the gate electrode layer 141a and the semiconductor layer 131a form the load transistor Q6.

A region 135b of the semiconductor layer 131b is arranged to confront the gate electrode layer 141b in the direction of the lamination and constitutes a channel region. The semiconductor layer 131b has a drain region 135a and a source region 135c arranged on both sides of the channel region 135b. Further, a region 133b of the semiconductor layer 131a is arranged to confront the gate electrode layer 141a in the direction of the lamination and constitutes a channel region. The semiconductor layer 131a has a drain region 133a and a source region 133c arranged on both sides of the channel region 133b.

The drain regions 133a and 135a are electrically connected with the gate electrode layers 141b and 141a, respectively, through the contact holes 172a and 172b. The source regions 133c and 135c are stretched in the direction of the arrow Y and used for the Vcc wirings.

The semiconductor layers 131a and 131b are formed by injecting p-type impurities into a polycrystalline silicon layer patterned with a mask 139 of photoresist or the like. Namely, the regions having the impurities injected therein become the drain regions 133a and 135a and the source regions 133c and 135c and the regions free from the injection become the channel regions 133b and 135b.

The planar layout structure of the semiconductor layers 131a and 131b has a symmetrical configuration about the point $S_1$, in the center.

Figure 15:
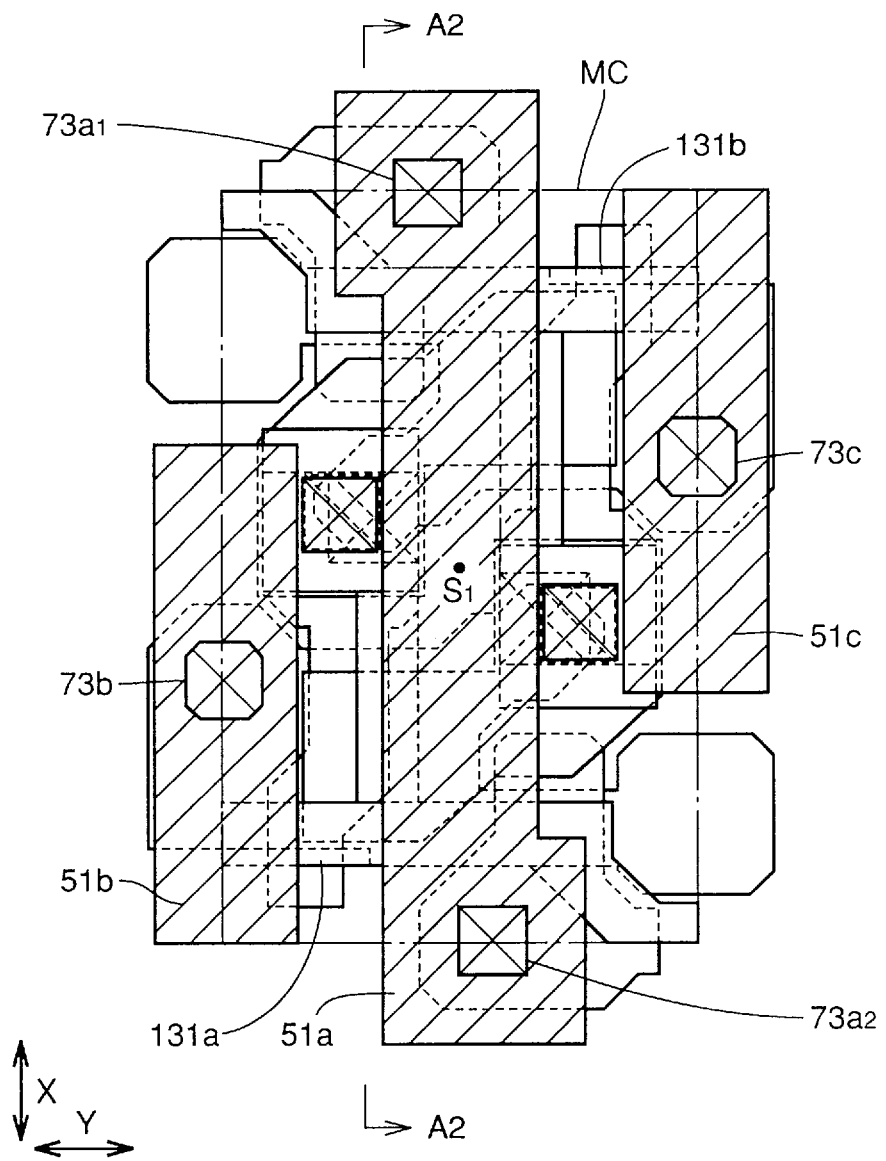

Referring chiefly to FIG. 12 and FIG. 15, there is formed an insulating layer 73 to cover the semiconductor layers 131a and 131b. In the insulating layer 73, there are formed contact holes $73a_1$, $73a_2$, 73b, and 73c, through which are disposed a conducting layer 51a serving as the word line and conducting layers 51b and 51c serving as the pad electrode layers in contact with their respective mating members lying on the layer under the same. Since the word line 51a and the pad electrode layers 51b and 51c are virtually the same in structure as those in the above described embodiment 1, description of the same will be omitted.

Figure 16:
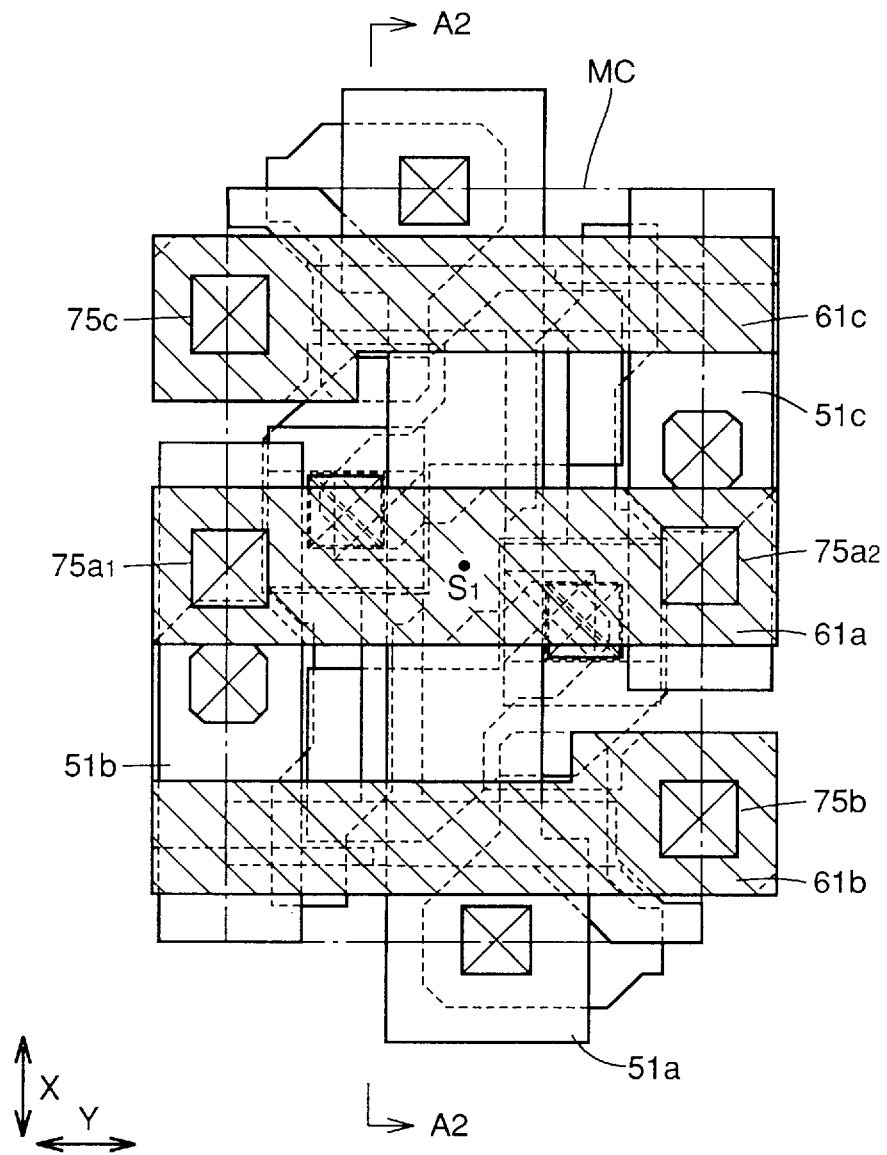

Referring now to FIG. 12 and FIG. 16, there is formed an insulating layer 75 to cover the word line 51a and the pad electrode layers 51b and 51c. In the insulating layer 75, there are formed contact holes $75a_1$, $75a_2$, 75b, and 75c, through which are disposed a conducting layer 61a serving as the GND wiring layer and conducting layers 61b and 61c serving as the bit lines in contact with their respective mating members lying on the layer under the same. Since the GND wiring layer 61a and the bit lines 61b and 61c are virtually the same in structure as those in the above described embodiment 1, description of the same will be omitted.

Embodiment 3

Figure 17:
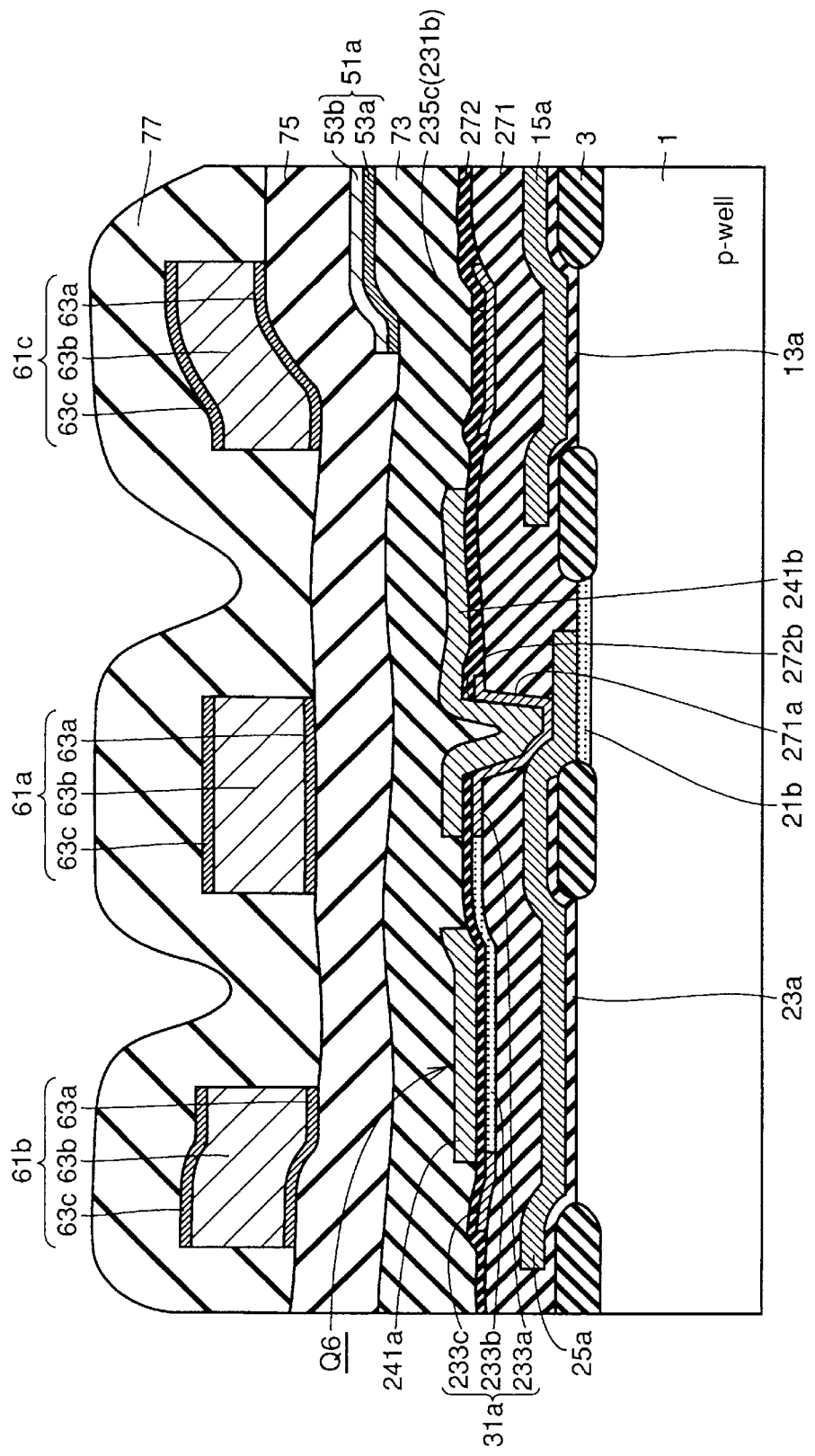
FIG. 17 is a sectional view schematically showing an SRAM memory cell structure of a third embodiment of the invention.
Figure 18:
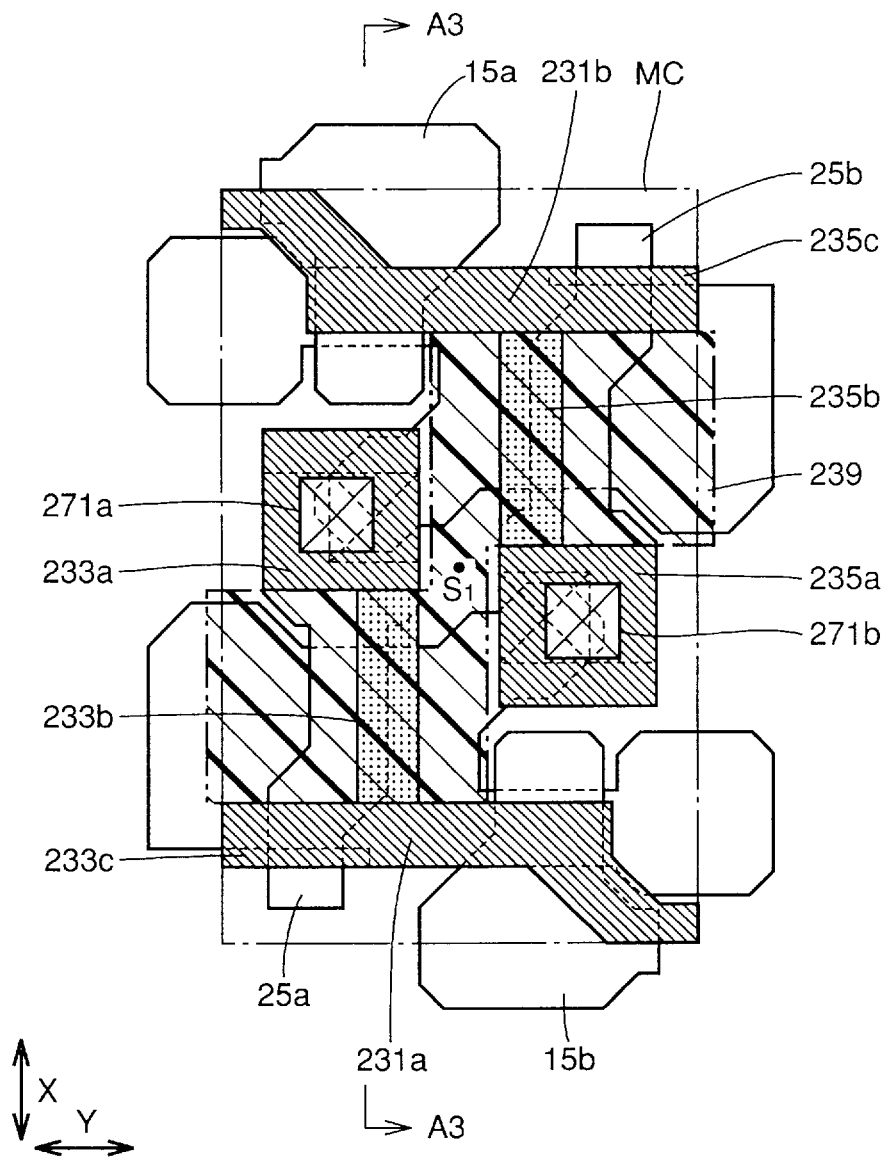
FIG. 18 to FIG. 20 are planar structural drawings showing three separated levels from the bottom up of the SRAM memory cell structure of the third embodiment of the invention.
Figure 19:
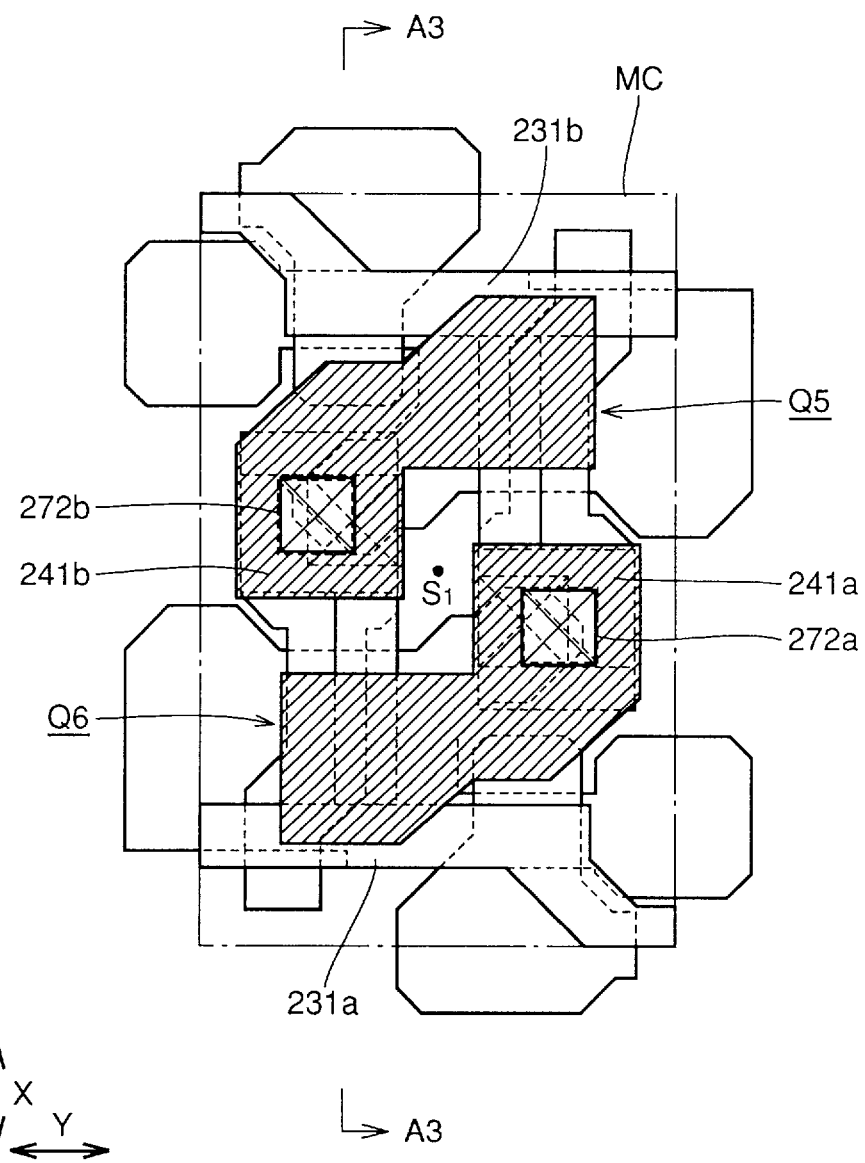

FIG. 17 is a sectional view taken along line A3—A3 of FIG. 18 and FIG. 19. Since, in the SRAM memory cell structure of the present embodiment, the pair of the driver transistors Q1 and Q2 and the pair of the access transistors Q3 and Q4 are virtually the same in structure as those in the embodiment 1 shown in FIG. 3, description of the same will be omitted.

Referring to FIG. 17 to FIG. 19, a top gate type TFT is used as the load element in this embodiment. The top gate type TFT is a transistor whose gate electrode layer lies on the layer above the channel region. To be concrete, gate electrodes 241*a* and 241*b* are formed on the layer over the semiconductor layers 231*a* and 231*b* including the channel regions 233*b* and 235*b*, the drain regions 233*a* and 235*a*, and the source regions 233*c* and 235*c*. Particulars of structure other than those described above are virtually the same as those in the embodiment 2 including the structures of the word lines, pad electrode layers, GND wiring layers, and the bit lines, and, therefore, description of the same will be omitted.

Embodiment 4

Figure 20:
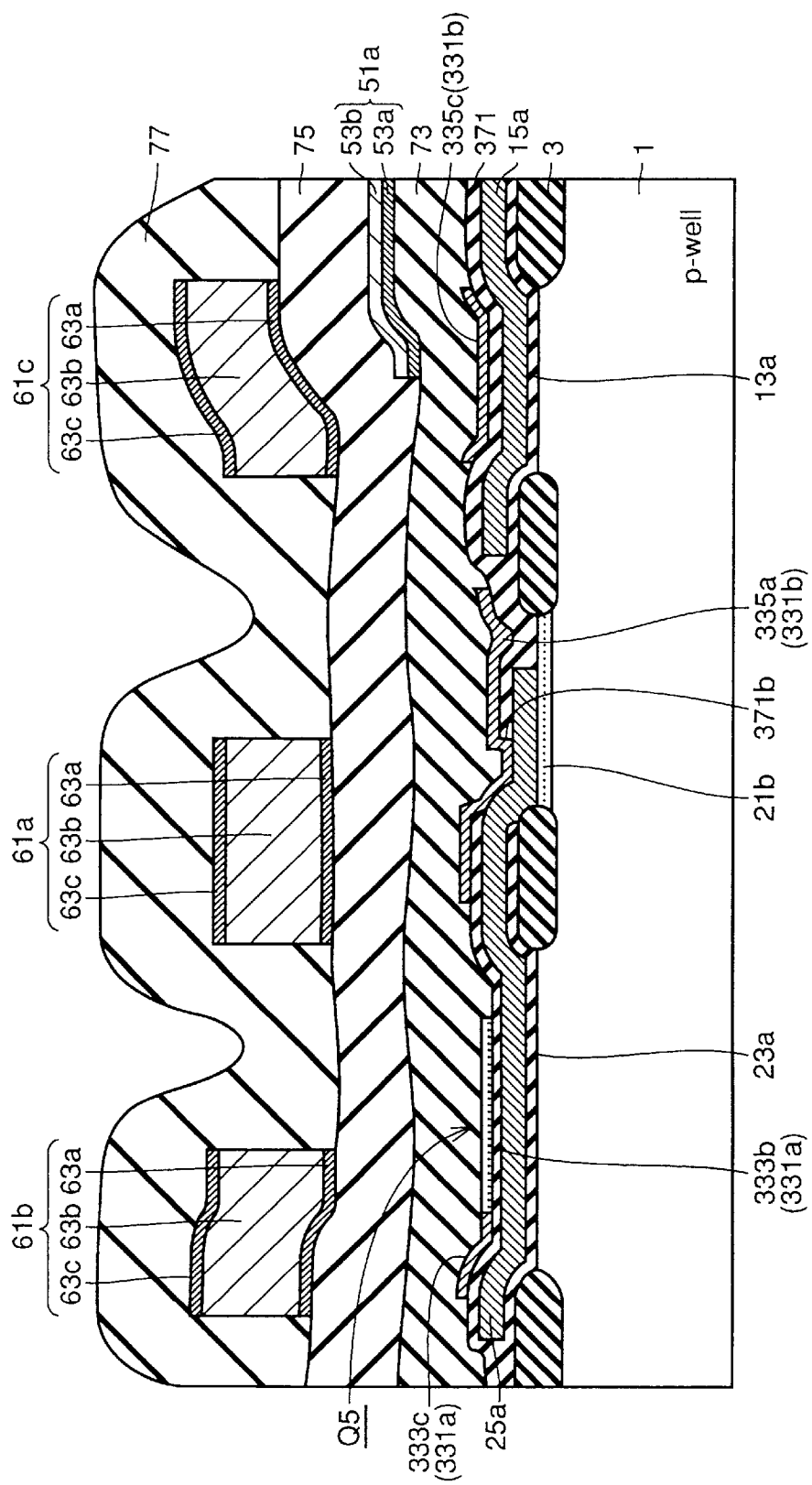
Figure 21:
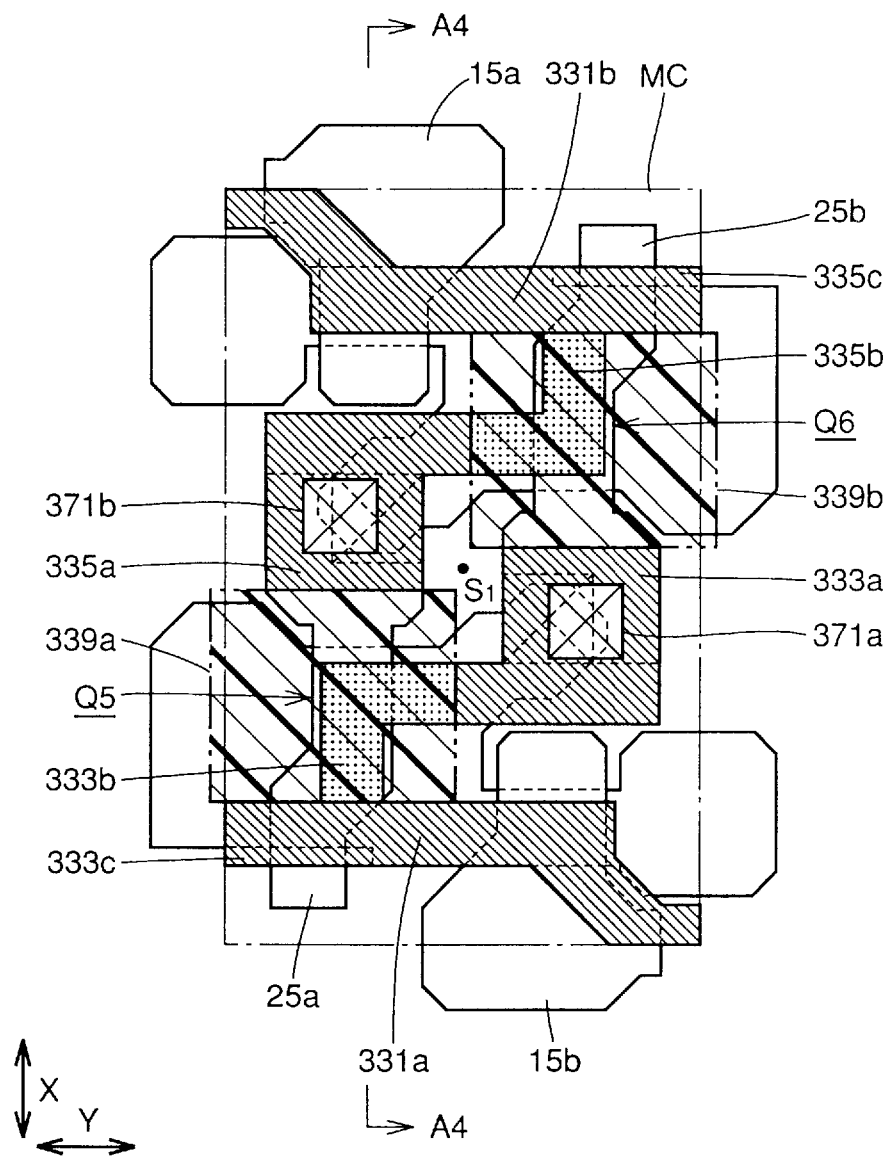
FIG. 21 to FIG. 23 are planar structural drawings showing three separated levels from the bottom up of an SRAM memory cell structure of a fourth embodiment of the invention.
Figure 22:
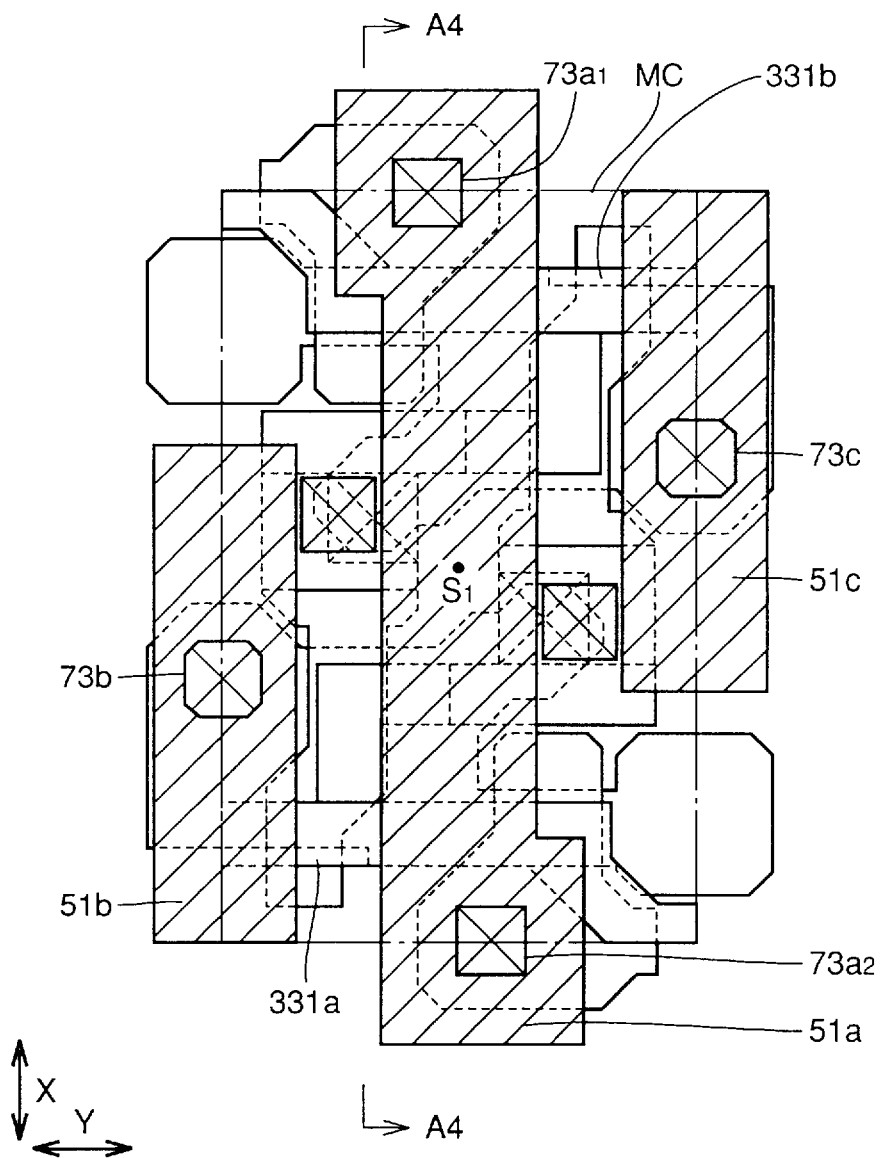
Figure 23:
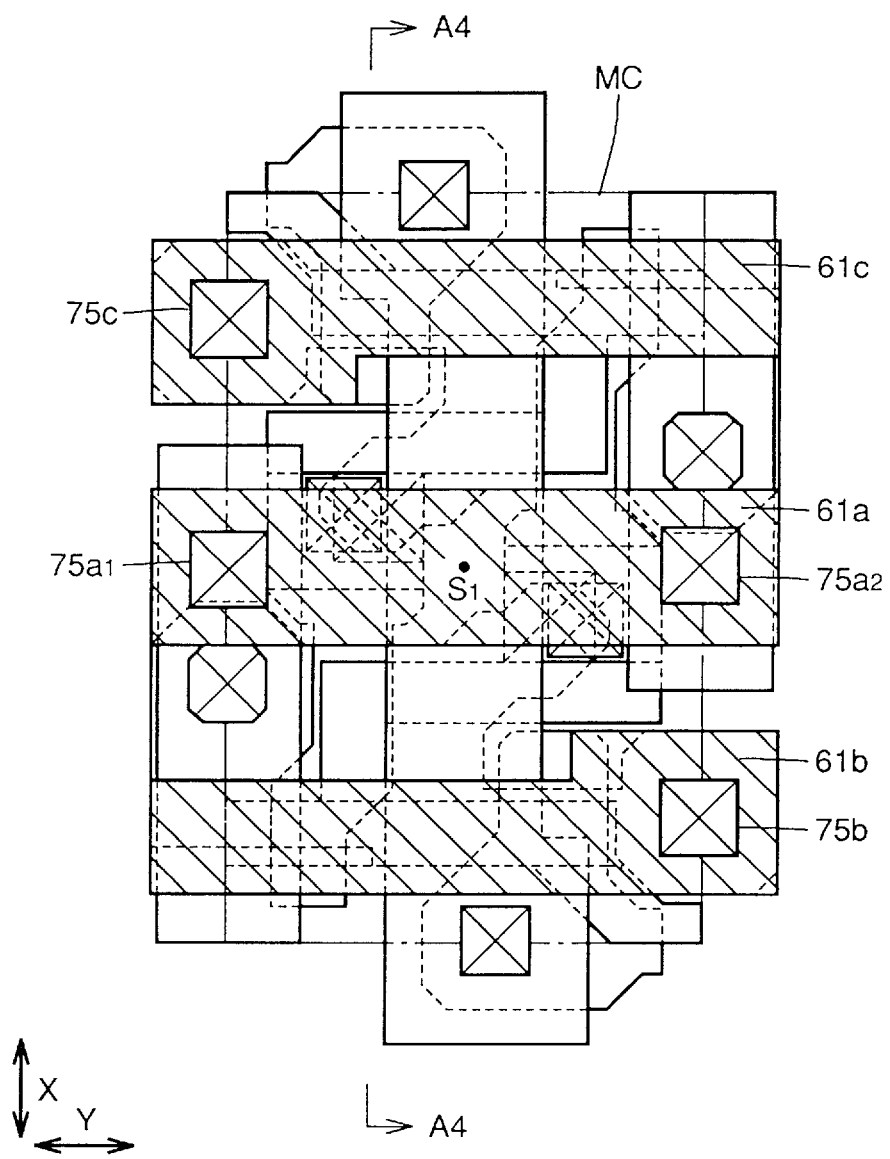

FIG. 20 is a sectional view taken along line A4—A4 of FIG. 21 to FIG. 23. In this embodiment, the gate electrode layer of the driver transistor is used as the gate electrode layer of the load transistor.

Since, in the SRAM memory cell structure of the present embodiment, the pair of the driver transistors Q1 and Q2 and the pair of the access transistors Q3 and Q4 are virtually the same in structure as those in the embodiment 1 shown in FIG. 3, description of the same will be omitted.

Referring chiefly to FIG. 20 and FIG. 21, an insulating layer 371 is formed to cover the driver transistors Q1 and Q2 and the access transistors Q3 and Q4. The insulating layer 371 has contact holes 371*a* and 371*b* formed therein. There is formed a semiconductor layer 331*a* in contact with the gate electrode layer 25*b* of the driver transistor Q2 through the contact hole 371*a*. Also, there is formed a semiconductor layer 331*b* in contact with the gate electrode layer 25*a* of the driver transistor Q1 through the contact hole 371*b*.

The semiconductor layer 331*a* has the drain region 333*a*, the channel region 333*b*, and the source region 333*c*. The channel region 333*b* is in confrontation with the gate electrode layer 25*a* in the direction of the lamination. The drain region 333*a* and the source region 333*c* are arranged on both sides of the channel region 333*b*. The drain region 333*a* is in contact with the gate electrode layer 25*b* of the driver transistor Q2 through the contact hole 371*a*. The source region 333*c* is stretched in the direction of the arrow Y and used for the Vcc wiring.

The semiconductor layer 331*b* has the drain region 335*a*, the channel region 335*b*, and the source region 335*c*. The channel region 335*b* is formed in confrontation with the gate electrode layer 25*b* in the direction of the lamination. The drain region 335*a* and the source region 335*c* are arranged on both sides of the channel region 335*b*. The drain region 335*a* is formed in contact with the gate electrode layer 25*a* of the driver transistor Q1 through the contact hole 371*b*. The source region 335*c* is stretched in the direction of the arrow Y and used for the Vcc wiring.

The semiconductor layer 331*a* and the gate electrode layer 25*a* of the driver transistor Q1 form the load transistor Q5. Further, the semiconductor layer 331*b* and the gate electrode layer 25*b* of the driver transistor Q2 form the load transistor Q6.

The semiconductor layers 331*a* and 331*b* are formed by injecting p impurities into a polycrystalline silicon layer patterned with masks 339*a* and 339*b* of photoresist or the like. More specifically, regions into which impurities are injected become the source regions 333*c* and 335*c* and the drain regions 333*a* and 335*a*, and the regions free from the injection become channel regions 333*b* and 335*b*. The source regions 333*c* and 335*c* are used for the Vcc wirings.

Referring chiefly to FIG. 20 and FIG. 22, there is formed an insulating layer 73 to cover the semiconductor layers 331*a* and 331*b*. In the insulating layer 73, there are formed contact holes 73$a_1$, 73$a_2$, 73*b*, and 73*c*, through which are disposed a conducting layer 51*a* serving as the word line and conducting layers 51*b* and 51*c* serving as the pad electrode layers in contact with their respective mating members lying on the layer under the same. Since the word line 51*a* and the pad electrode layers 51*b* and 51*c* are virtually the same in structure as those in the above described embodiment 1, description of the same will be omitted.

Referring chiefly to FIG. 20 and FIG. 23, there is formed an insulating layer 75 to cover the word line 51*a* and the pad electrode layers 51*b* and 51*c*. In the insulating layer 75, there are formed contact holes 75$a_1$, 75$a_2$, 75*b*, and 75*c*, through which are disposed a conducting layer 61*a* serving as the GND wiring layer and conducting layers 61*b* and 61*c* serving as the bit lines in contact with their respective mating members lying on the layer under the same. Since the GND wiring layer 61*a* and the bit lines 61*b* and 61*c* are virtually the same in structure as those in the above described embodiment 1, description of the same will be omitted.

Embodiment 5

Figure 24:
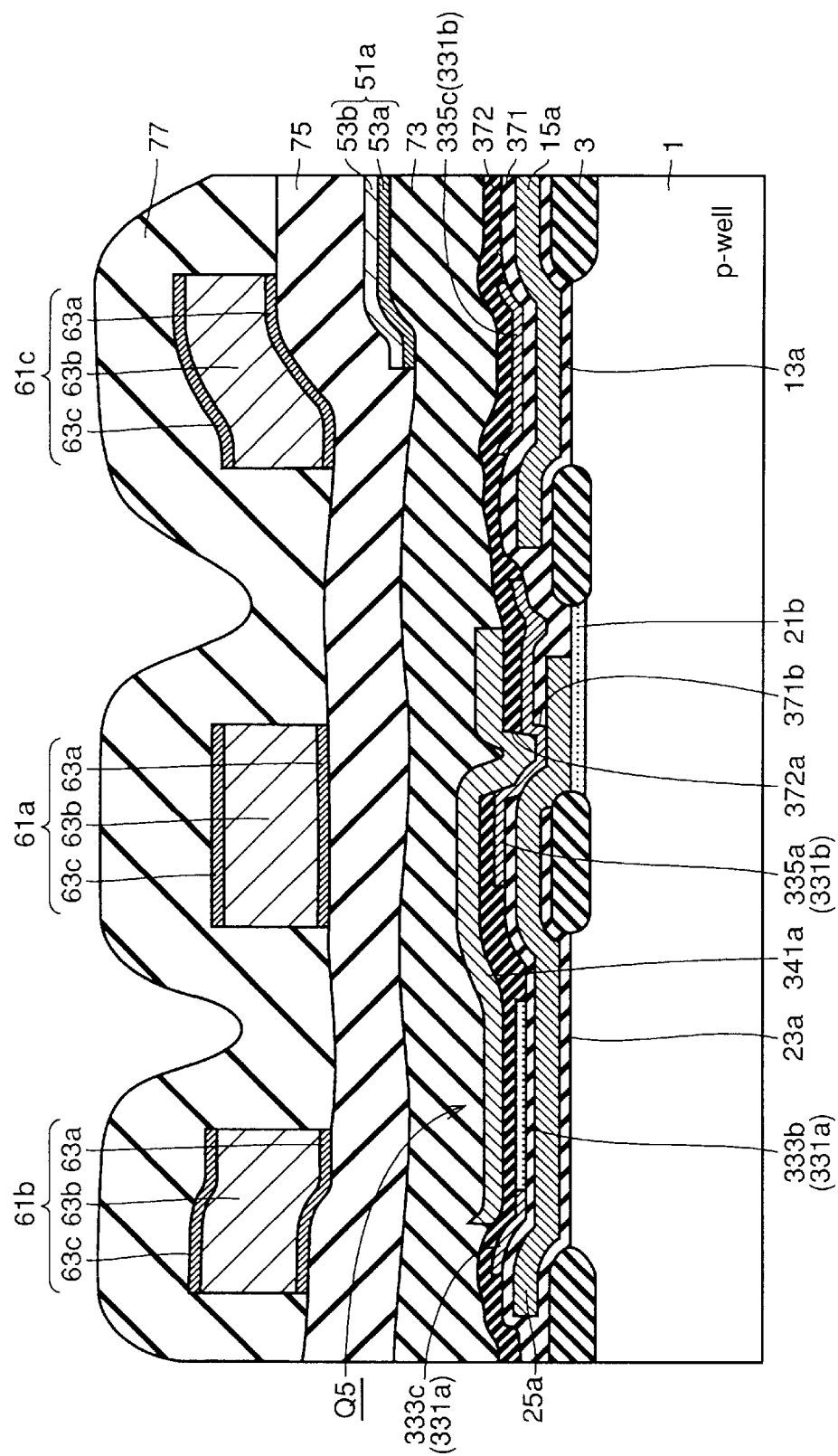
FIG. 24 is a sectional view schematically showing an SRAM memory cell structure of a fifth embodiment of the invention.
Figure 25:
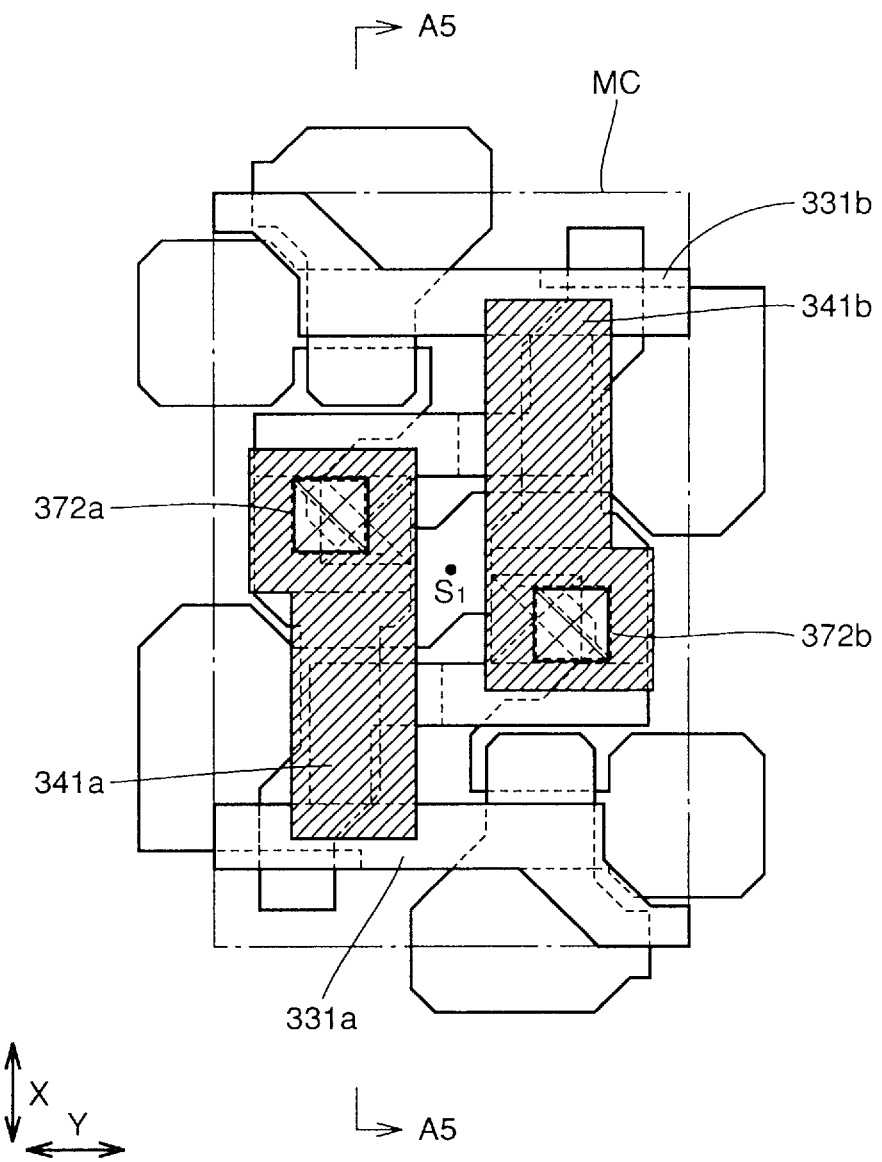
FIG. 25 to FIG. 27 are planar structural drawings showing three separated levels from the bottom up of the SRAM memory cell structure of the fifth embodiment of the invention.
Figure 26:
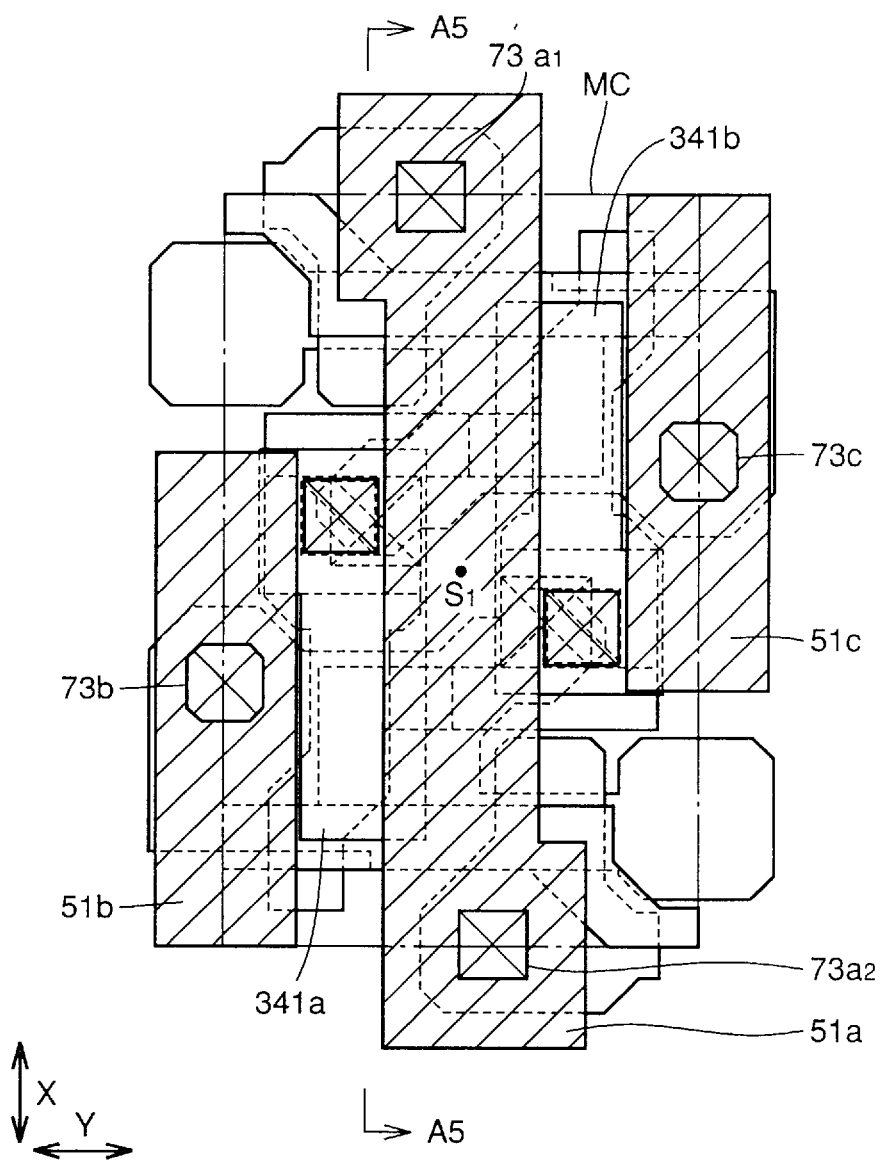
Figure 27:
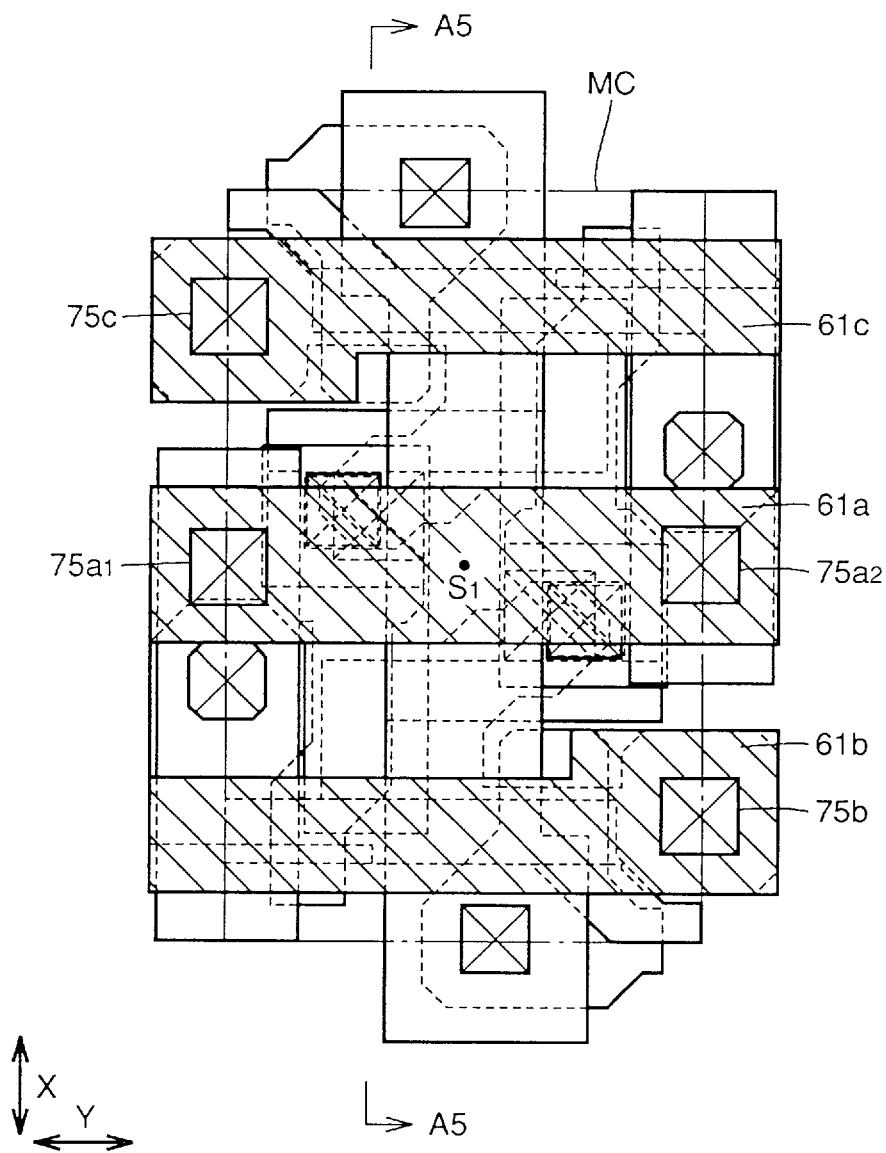

FIG. 24 is a sectional view taken along line A5—A5 of FIG. 25 to FIG. 27.

In the present embodiment, a so-called double gate type TFT is used as the load element.

In the SRAM memory cell structure of the embodiment, the pair of the driver transistors Q1 and Q2 and the pair of the access transistors Q3 and Q4 are virtually the same in structure as those in the embodiment 1 shown in FIG. 3 and, therefore, description of the same will be omitted. Further, in the SRAM memory cell structure of the embodiment, since the semiconductor layers constituting the pair of the load transistors Q5 and Q6 are virtually the same in structure as those in the embodiment 4 shown in FIG. 21, description of the same will be omitted.

Referring chiefly to FIG. 24 and FIG. 25, there is formed an insulating layer 372 to cover gate electrode layers 331*a* and 331*b*. The insulating layer 372 has contact holes 372*a* and 372*b* formed therein.

There is formed a gate electrode layer 341*a* in contact with the drain region 335*a* of the semiconductor layer 331*b* through the contact hole 372*a*. The gate electrode layer 341*a* is arranged to confront the channel region 333*b* of the semiconductor layer 331*a* in the direction of the lamination. Further, there is formed a gate electrode layer 341*b* in contact with the drain region 333*a* of the semiconductor layer 331*a* through the contact hole 372*b*. The gate electrode layer 341*b* is arranged to confront the channel region 335*b* of the semiconductor layer 331*b* in the direction of the lamination. The gate electrode layers 341*a* and 341*b* are formed for example of doped polycrystalline silicon and stretched in the direction of the arrow X.

Referring chiefly to FIG. 24 and FIG. 26, there is formed an insulating layer 73 to cover the semiconductor layers 341*a* and 341*b*. In the insulating layer 73, there are formed contact holes 73$a_1$, 73$a_2$, 73*b*, and 73*c*, through which are disposed a conducting layer 51*a* serving as the word line and conducting layers 51*b* and 51*c* serving as the pad electrode layers in contact with their respective mating members lying on the layer under the same. Since the word line 51*a* and the pad electrode layers 51*b* and 51*c* are virtually the same in structure as those in the above described embodiment 1, description of the same will be omitted.

Referring chiefly to FIG. 24 and FIG. 27, there is formed an insulating layer 75 to cover the word line 51*a* and the pad electrode layers 51*b* and 51*c*. In the insulating layer 75, there are formed contact holes $75a_1$, $75a_2$, $75b$, and $75c$, through which are disposed a conducting layer $61a$ serving as the GND wiring layer and conducting layers $61b$ and $61c$ serving as the bit lines in contact with their respective mating members lying on the layer under the same. Since the GND wiring layer $61a$ and the bit lines $61b$ and $61c$ are virtually the same in structure as those in the above described embodiment 1, description of the same will be omitted.

In the above described embodiment 2 to embodiment 5, the same as in the embodiment 1, the gate electrode layers $15a$ and $15b$ of the first and second access transistors are provided on a layer different from that on which the word line $51a$ is provided. Therefore, the planar layout area of the memory cell can be reduced as with the embodiment 1.

Further, in the embodiment 2 to embodiment 5, the same as in the embodiment 1, the GND wiring $61a$ is provided on the layer over that on which the load transistor serving as the load element is provided. Therefore, the wiring resistance of the GND wiring $61a$ can be lowered as with the embodiment 1. Accordingly, destruction of stored data and inversion of data when it is read can be prevented and stabilized operation of the memory can be achieved.

Further, in the embodiment 2 to embodiment 5, the same as in the embodiment 1, the GND wiring layer $61a$ is provided over the layer on which the word line $51a$ is provided. Therefore, an SRAM memory cell structure capable of still stabilized operation can be obtained as with the embodiment 1.

Further, in the embodiment 2 to embodiment 5, the same as in the embodiment 1, the bit lines $61b$ and $61c$ are connected with transistors lying on the layer under the same by the pad electrode layers $51b$ and $51c$ interposed therebetween. Therefore, the degree of freedom of arrangement of the bit lines $61b$ and $61c$ is extended and it is made possible to form the bit lines $61b$ and $61c$ and the GND wiring layer $61a$ on the same layer as with the embodiment 1.

As the high melting point silicide layer described in the embodiment 1 to embodiment 5 above, such materials as tungsten silicide ($WSi_2$), titan silicide ($TiSi_2$), and molybdenum silicide ($MoSi_2$) can be used.

In the embodiment 1 to embodiment 5, SRAM memory cell structures having high resistances R1 and R2 or load transistors Q5 and Q6 as the load elements have been described. The invention may, however, be applied to an SRAM memory cell structure having other than those as the load elements.

In the semiconductor memory device according to the invention, the gate electrode layers of the first and second access transistors are provided on a different layer from that on which the word line is provided. Accordingly, the need for stretching the gate electrode layer itself of the access transistor so as to laterally cut through the memory cell can be eliminated. Hence, the area within the memory cell occupied by the gate electrode layer can be reduced. Thus, the planar layout area of the memory cell can be reduced correspondingly to the reduction in the gate electrode layer.

Further, since the planar area occupied by the gate electrode layer of the access transistor is reduced, the degree of freedom of arrangement of the gate electrode layer of the driver transistor can be extended. Also in this regard, the planar layout area can be reduced.

The conducting layer for grounding and the conducting layer for word line are formed over the layer on which the loading elements are provided. Therefore, the layout of the conducting layer for grounding is not restricted by the contact holes for connecting the load element with the transistor on the layer under the same. Accordingly, the wiring resistance of the conducting layer for grounding can be lowered and, hence, destruction of stored data and inversion of data when it is read can be prevented and stabilized operation of the memory can be realized.

In the semiconductor memory device according to a preferred aspect of the invention, the conducting layer for grounding is provided over the conducting layer for word line, and, therefore, the conducting layer for grounding can be formed of such a low melting point material as aluminum. Accordingly, the wiring resistance of the conducting layer for grounding can further be reduced and, thus, an SRAM memory cell structure capable of more stabilized operation can be obtained.

In the semiconductor memory device according to another preferred aspect of the invention, the conducting layers for bit line are connected with transistors disposed on the layer under the same by the pad electrode layers interposed therebetween. By the interposition of the pad electrode layers, the layout of the contact holes for connecting the conducting layers for bit line with their mating members on the layer under the same becomes easy and the degree of freedom of arrangement of the conducting layers for bit line can be extended. Accordingly, the conducting layers for bit line and the conducting layer for grounding can be formed on the same layer.

What is claimed is:

1. A semiconductor memory device including a static type memory cell having a pair of access transistors, a pair of driver transistors, and a pair of load elements within the memory cell region comprising:

a semiconductor substrate having a major surface;

a first access transistor having a pair of first source/drain regions formed at the major surface of said semiconductor substrate a predetermined distance apart from each other and a first gate electrode layer formed on the major surface of said semiconductor substrate disposed between the pair of said first source/drain regions, with a gate insulating film interposed therebetween;

a second access transistor having a pair of second source/drain regions formed at the major surface of said semiconductor substrate a predetermined distance apart from each other and a second gate electrode layer formed of the same conducting layer as said first gate electrode layer, separately therefrom, on the major surface of said semiconductor substrate disposed between the pair of said second source/drain regions, with a gate insulating film interposed therebetween;

a first driver transistor having a pair of third source/drain regions formed at the major surface of said semiconductor substrate a predetermined distance apart from each other and a third gate electrode layer formed on the major surface of said semiconductor substrate disposed between the pair of said third source/drain regions, with a gate insulating film interposed therebetween, and electrically connected with one of the pair of said second source/drain regions;

a second driver transistor having a pair of fourth source/drain regions formed at the major surface of said semiconductor substrate a predetermined distance apart from each regions formed at the major surface of said semiconductor substrate a predetermined distance apart from each other and a first gate electrode layer formed on the major surface of said semiconductor substrate disposed between the pair of said first source/drain regions, with a gate insulating film interposed therebetween;

a second access transistor having a pair of second source/drain regions formed at the major surface of said semiconductor substrate a predetermined distance apart from each other and a second gate electrode layer formed of the same conducting layer as said first gate electrode layer, separately therefrom, on the major surface of said semiconductor substrate disposed between the pair of said second source/drain regions, with a gate insulating film interposed therebetween;

a first driver transistor having a pair of third source/drain regions formed at the major surface of said semiconductor substrate a predetermined distance apart from each other and a third gate electrode layer formed on the major surface of said semiconductor substrate disposed between the pair of said third source/drain regions, with a gate insulating film interposed therebetween, and electrically connected with one of the pair of said second source/drain regions;

a second driver transistor having a pair of fourth source/drain regions formed at the major surface of said semiconductor substrate a predetermined distance apart from each other and a fourth gate electrode layer formed on the major surface of said semiconductor substrate disposed between the pair of said fourth source/drain regions, with a gate insulating film interposed therebetween, and electrically connected with one of the pair of said first source/drain regions;

a first insulating layer formed to cover the periphery and the top of the gate electrode layer of each of said transistors and having a first hole led to the top face of said fourth gate electrode layer and a second hole led to the top face of said third gate electrode layer formed therein;

a first load element electrically connected with one of the pair of said first source/drain regions via the fourth gate through said first hole;

a second load element electrically connected with one of the pair of said second source/drain regions via the third gate through said second hole;

a second insulating layer formed to cover said first and second load elements; wherein said first and second insulating layers have a third hole led to the top face of said first gate electrode layer, a fourth hole led to the top face of said second gate electrode layer, and a fifth and a sixth hole led to one of the pair of said third source/drain regions and one of the top of the pair of said fourth source/drain regions, respectively, through said first and second insulating layers; said semiconductor memory device further comprising:

a conducting layer for word line formed on said second insulating layer above said first and second load elements and electrically connected with said first and second gate electrode layers through said third and fourth holes; and a conducting layer for grounding formed on said second insulating layer and electrically connected with one of the pair of said third source/drain regions and one of the pair of said fourth source/drain regions through said fifth and sixth holes.

2. A semiconductor memory device according to claim 1, further comprising a third insulating layer for covering said conducting layer for word line, wherein said third insulating layer has a seventh hole and an eighth hole passing through said third insulating layer, and said conducting layer for grounding is formed on said third insulating layer, electrically connected with one of the pair of said third source/drain regions through said fifth and seventh holes, and connected with one of the pair of said fourth source/drain regions through said sixth and eighth holes.

3. A semiconductor memory device according to claim 2, further comprising conducting layers for bit line formed of the same conducting layer as said conducting layer for grounding, separately therefrom, on said third insulating layer, wherein said first, second, and third insulating layers have a ninth hole led to the surface of the other of the pair of said first source/drain regions and a 10th hole led to the surface of the other of the pair of said second source/drain regions, said ninth and 10th holes passing through said first, second, and third insulating layers.

4. A semiconductor memory device according to claim 3, wherein said conducting layer for bit line has a first and a second bit line formed of the same conducting layer, separately therefrom, said first bit line is electrically connected with the other of said first source/drain regions through said ninth hole, and said second bit line is electrically connected with the other of said second source/drain regions through said 10th hole.

5. A semiconductor memory device according to claim 3, wherein said conducting layer for grounding and said conducting layers for bit line are formed of a layer containing aluminum.

6. A semiconductor memory device according to claim 5, wherein said conducting layer for grounding and said conducting layers for bit line are formed of a laminated structure of a TiN layer, an Al—Si—Cu layer, and a TiN layer.

7. A semiconductor memory device according to claim 1, wherein said first load element has a first resistance layer and said second load element has a second resistance layer, one end of said first resistance layer is electrically connected with said fourth gate electrode layer and the other end is connected with a power source potential line, and one end of said second resistance layer is electrically connected with said third gate electrode layer and the other end is connected with said power source potential line.

8. A semiconductor memory device according to claim 1, wherein said first load element has a first load transistor and said second load element has a second load transistor, said first load transistor has a first semiconductor layer on which a pair of fifth source/drain regions are formed to define a first channel region, said second load transistor has a second semiconductor layer on which a pair of sixth source/drain regions are formed to define a second channel region, one of said fifth source/drain regions is electrically connected with said fourth gate electrode layer and the other of said fifth source/drain regions is connected with a power source potential line, and one of said sixth source/drain regions is electrically connected with said third gate electrode layer and the other of said sixth source/drain regions is connected with said power source potential line.

9. A semiconductor memory device according to claim 8, further comprising:
   a fifth gate electrode layer confronting said first channel region with a gate insulating film interposed therebetween; and
   a sixth gate electrode layer confronting said second channel region with a gate insulating film interposed therebetween; wherein
   said fifth gate electrode layer is electrically connected with said third gate electrode layer, and
   said sixth gate electrode layer is electrically connected with said fourth gate electrode layer.

10. A semiconductor memory device according to claim 9, wherein
   said fifth and sixth gate electrode layers are formed in the layer under said first and second semiconductor layers.

11. A semiconductor memory device according to claim 9, wherein
   said fifth and sixth gate electrode layers are formed in the layer over said first and second semiconductor layers.

12. A semiconductor memory device according to claim 8, wherein
   said third gate electrode layer confronts said first channel region with said first insulating layer interposed therebetween and serves as the gate electrode layer of said first load transistor, and
   said fourth gate electrode layer confronts said second channel region with said first insulating layer interposed therebetween and serves as the gate electrode layer of said second load transistor.

13. A semiconductor memory device according to claim 12, further comprising a seventh gate electrode layer confronting said first channel region with said first gate insulating layer interposed therebetween and a eighth gate electrode layer confronting said second channel region with said second gate insulating layer interposed therebetween, wherein
   said seventh gate electrode layer is electrically connected with said third gate electrode layer and said eighth gate electrode layer is electrically connected with said fourth gate electrode layer,
   said first channel region is disposed between said third gate electrode layer and said seventh gate electrode layer, and
   said second channel region is disposed between said fourth gate electrode layer and said eighth gate electrode layer.

14. A semiconductor memory device according to claim 2, further comprising:
   a first pad electrode layer formed on said second insulating layer so as to be electrically connected with one of the pair of said third source/drain regions through said fifth hole; and
   a second pad electrode layer formed on said second insulating layer so as to be electrically connected with one of the pair of said fourth source/drain regions through said sixth hole, wherein
   said first and second pad electrode layers are formed of the same conducting layer as said conducting layer for word line, separately therefrom,
   said seventh hole is formed so as to be led to the top face of said first pad electrode layer,
   said eighth hole is formed so as to be led to the top face of said second pad electrode layer, and
   said conducting layer for grounding is electrically connected with said first and second pad electrode layers through said seventh and eighth holes.

15. A semiconductor memory device according to claim 1, wherein
   said conducting layer for word line is formed of a layer containing polycrystalline silicon doped with impurities.

16. A semiconductor memory device according to claim 15, wherein
   said first and second pad electrode layers are formed of a layer containing polycrystalline silicon doped with impurities.

* * * * *

UNITED STATES PATENT AND TRADEMARK OFFICE
CERTIFICATE OF CORRECTION

PATENT NO. : 5,818,089
DATED : October 6, 1998
INVENTOR(S) : Nobuyuki KOKUBO

It is certified that error appears in the above-indentified patent and that said Letters Patent is hereby corrected as shown below:  Item [56]

On the cover page, under Related U.S. Application Data, replace "Jun. 6, 1995" with --Jun. 5, 1995--

Signed and Sealed this

Second Day of March, 1999

Attest:

Attesting Officer

Q. TODD DICKINSON

Acting Commissioner of Patents and Trademarks